(12) United States Patent
Fukuzumi et al.

(10) Patent No.: US 8,335,111 B2
(45) Date of Patent: Dec. 18, 2012

(54) NON-VOLATILE SEMICONDUCTOR STORAGE DEVICE AND METHOD OF MANUFACTURING THE SAME

(75) Inventors: Yoshiaki Fukuzumi, Yokohama (JP);
Ryota Katsumata, Yokkaichi (JP);
Megumi Ishiduki, Yokkaichi (JP);
Hideaki Aochi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 283 days.

(21) Appl. No.: 12/886,854

(22) Filed: Sep. 21, 2010

(65) Prior Publication Data

US 2012/0008400 A1     Jan. 12, 2012

(30) Foreign Application Priority Data

Jul. 12, 2010   (JP) ................................. 2010-157822

(51) Int. Cl.
*G11C 16/04*      (2006.01)
*H01L 29/792*     (2006.01)
*H01L 21/336*     (2006.01)

(52) U.S. Cl. ........... 365/185.18; 257/324; 257/E21.423; 257/E29.309; 438/591

(58) Field of Classification Search .................... None
See application file for complete search history.

(56) References Cited

U.S. PATENT DOCUMENTS

2007/0252201 A1   11/2007   Kito et al.
2009/0230450 A1 *  9/2009   Shiino et al. .................. 257/314
2010/0207195 A1    8/2010   Fukuzumi et al.

FOREIGN PATENT DOCUMENTS

JP        2007/266143      10/2007

OTHER PUBLICATIONS

U.S. Appl. No. 12/846,234, filed Jul. 29, 2010, Kiyotaro Itagaki, et al.
U.S. Appl. No. 12/834,390, filed Jul. 12, 2010, Megumi Ishiduki, et al.
U.S. Appl. No. 12/883,757, filed Sep. 16, 2010, Masaru Kidoh, et al.

* cited by examiner

*Primary Examiner* — Hoai V Ho
*Assistant Examiner* — James G Norman
(74) *Attorney, Agent, or Firm* — Oblon, Spivak, McClelland, Maier & Neustadt, L.L.P.

(57) ABSTRACT

A non-volatile semiconductor storage device includes: a memory string; a select transistor; and a carrier selection element. The select transistor has one end connected to one end of the memory string. The carrier selection element has one end connected to the other end of the select transistor, and selects a majority carrier flowing through respective bodies of the memory transistors and the select transistor. The carrier selection element includes: a third semiconductor layer; a metal layer; a second gate insulation layer; and a third conductive layer. The metal layer extends in the vertical direction. The metal layer extends in the vertical direction from the top of the third semiconductor layer. The second gate insulation layer surrounds the third semiconductor layer and the metal layer. The third conductive layer surrounds the third semiconductor layer and the metal layer via the second gate insulation layer and extends in a parallel direction.

20 Claims, 26 Drawing Sheets

NON-VOLATILE SEMICONDUCTOR STORAGE DEVICE AND METHOD OF MANUFACTURING THE SAME

CROSS-REFERENCE TO RELATED APPLICATIONS

This application is based upon and claims the benefit of priority from the prior Japanese Patent Application No. 2010-157822, filed on Jul. 12, 2010, the entire contents of which are incorporated herein by reference.

BACKGROUND

1. Field

Embodiments described herein relate to an electrically rewritable non-volatile semiconductor storage device and a method of manufacturing the same.

2. Description of the Related Art

As miniaturization technologies are pushed to the limit for improving the bit density of non-volatile semiconductor storage devices such as NAND type flash memory, there is increasing demand for lamination of memory transistors (memory cells). As one example, there has been proposed a lamination-type NAND flash memory where memory transistors are configured with vertical transistors. The lamination-type NAND flash memory has a memory string including a plurality of memory transistors connected in series in a lamination direction, and select transistors provided at each end of the memory string.

The lamination-type memory as described above generally performs an erase operation with a GIDL current (Gate Induced Drain Leakage current). That is, the lamination-type memory generates holes by a GIDL current caused by applying high electric fields to the gate end of a select transistor. Then, the lamination-type memory introduces the current produced by holes into the body of memory transistors to increase the potential of that body, and thereby performs an erase operation.

However, if the capacitance of the body of a memory string becomes larger as more memory transistors are connected in series, this may cause an erase operation using GIDL currents to slow down, or make the operation itself difficult.

DETAILED DESCRIPTION

Figure 1:
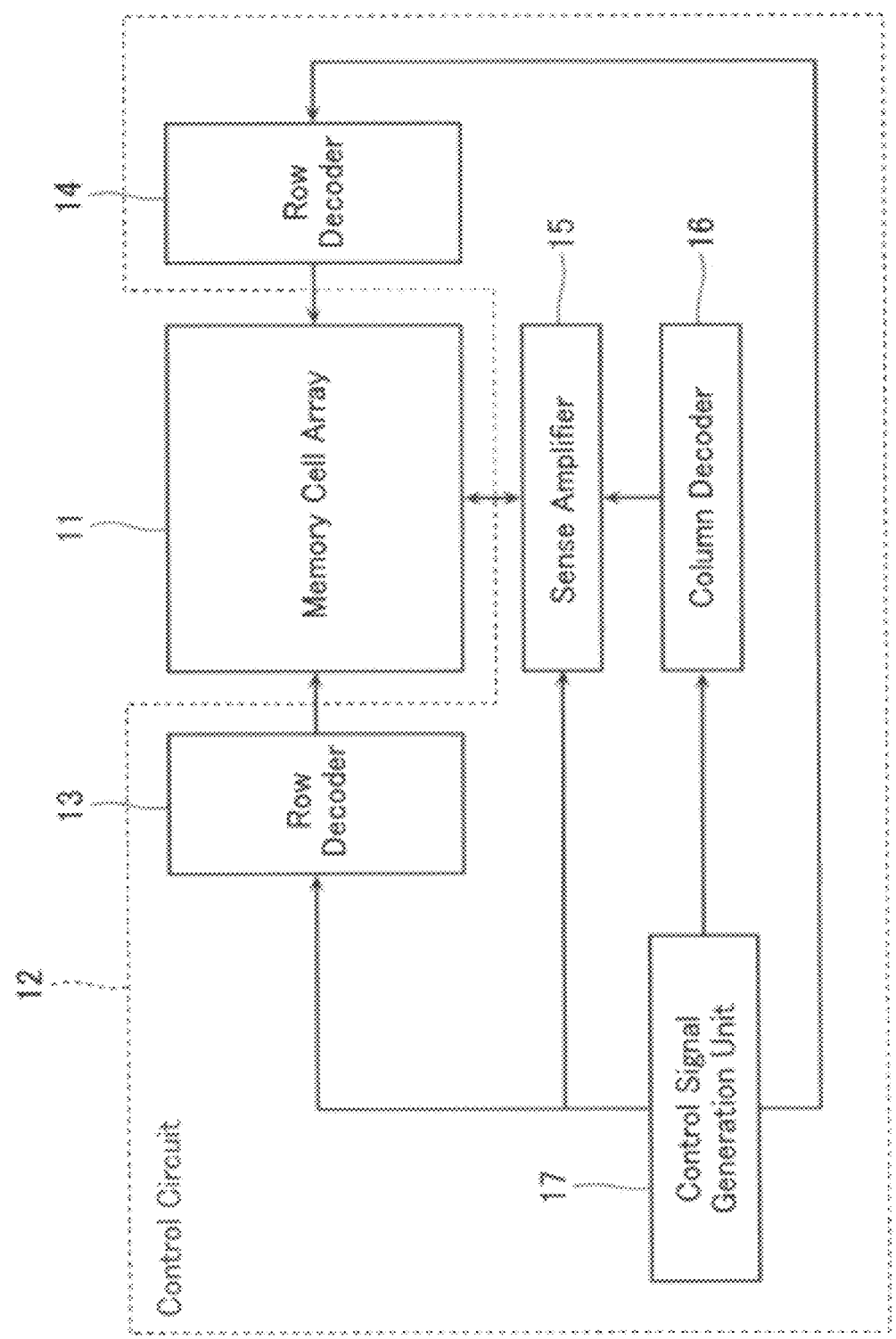
FIG. 1 is a circuit diagram of a non-volatile semiconductor storage device according to a first embodiment.

A non-volatile semiconductor storage device according to one aspect comprises: a memory string; a select transistor; a carrier selection element; and a control circuit. The memory string includes a plurality of memory transistors connected in series. The select transistor has one end connected to one end of the memory string. The carrier selection element has one end connected to the other end of the select transistor, and is operative to select a majority carrier flowing through respective bodies of the memory transistors and the select transistor. The control circuit is configured to control respective states of the memory string, the select transistor, and the carrier selection element. The select transistor comprises: a second semiconductor layer; a first gate insulation layer; and a second conductive layer. The first gate insulation layer extends in a vertical direction to a substrate and functions as a body of the select transistor. The first gate insulation layer is formed to surround the second semiconductor layer. The second conductive layer is formed to surround the second semiconductor layer via the first gate insulation layer and to extend in a parallel direction to the substrate, the second conductive layer functioning as a gate of the select transistor. The carrier selection element comprises: a third semiconductor layer; a metal layer; a second gate insulation layer; and a third conductive layer. The third semiconductor layer extends in the vertical direction to the substrate and functions as a body of the carrier selection element. The metal layer extends in the vertical direction to the substrate from a top surface of the third semiconductor layer. The second gate insulation layer is formed to surround the third semiconductor layer and the metal layer. The third conductive layer is formed to surround the third semiconductor layer and the metal layer via the second gate insulation layer and to extend in a parallel direction to the substrate, the third conductive layer functioning as a gate of the carrier selection element.

In a method of manufacturing a non-volatile semiconductor storage device according to one aspect, a plurality of first conductive layers, a second conductive layer, and a third conductive layer are first laminated. Then, a hole is formed to penetrate the plurality of first conductive layers, the second conductive layer, and the third conductive layer. Subsequently, a first gate insulation layer, a second gate insulation layer, and a third gate insulation layer are formed on respective side surfaces of the plurality of first conductive layers, the second conductive layer, and the third conductive layer, the side surfaces facing the hole. Then, a first semiconductor layer and a second semiconductor layer are formed on respective side surfaces of the first gate insulation layer and the second gate insulation layer, the side surfaces facing the hole, and a third semiconductor layer is formed on a side surface of the third gate insulation layer to a certain position between bottom and top surfaces of the third conductive layer, the side surface facing the hole. Subsequently, a metal layer is formed upward from the certain position on a side surface of the third gate insulation layer, the side surface facing the hole.

Embodiments of a non-volatile semiconductor storage device according to the present invention will now be described below with reference to the accompanying drawings.

[First Embodiment]
[Configuration]

Referring first to FIG. 1, a description is made on a non-volatile semiconductor storage device 100 according to a first embodiment. FIG. 1 is a block diagram of the non-volatile semiconductor storage device according to the first embodiment.

As illustrated in FIG. 1, the non-volatile semiconductor storage device according to the first embodiment comprises a control circuit 12 that controls different operations (such as write, read, or erase operations) on a memory cell array 11. The memory cell array 11 includes an array of memory transistors MTr providing memory cells. The control circuit 12 comprises row decoders 13, 14, a sense amplifier 15, a column decoder 16, and a control signal generation unit 17.

The row decoders 13, 14 decode captured signals, such as block address signals, to control the memory cell array 11. The sense amplifier 15 reads data from the memory cell array 11. The column decoder 16 decodes column address signals to control the sense amplifier 15. The control signal generation unit 17 boosts a reference voltage to generate a high voltage that is required at the time of write and erase operations. Furthermore, it generates control signals to control the row decoders 13, 14, the sense amplifier 15, and the column decoder 16.

Figure 2:
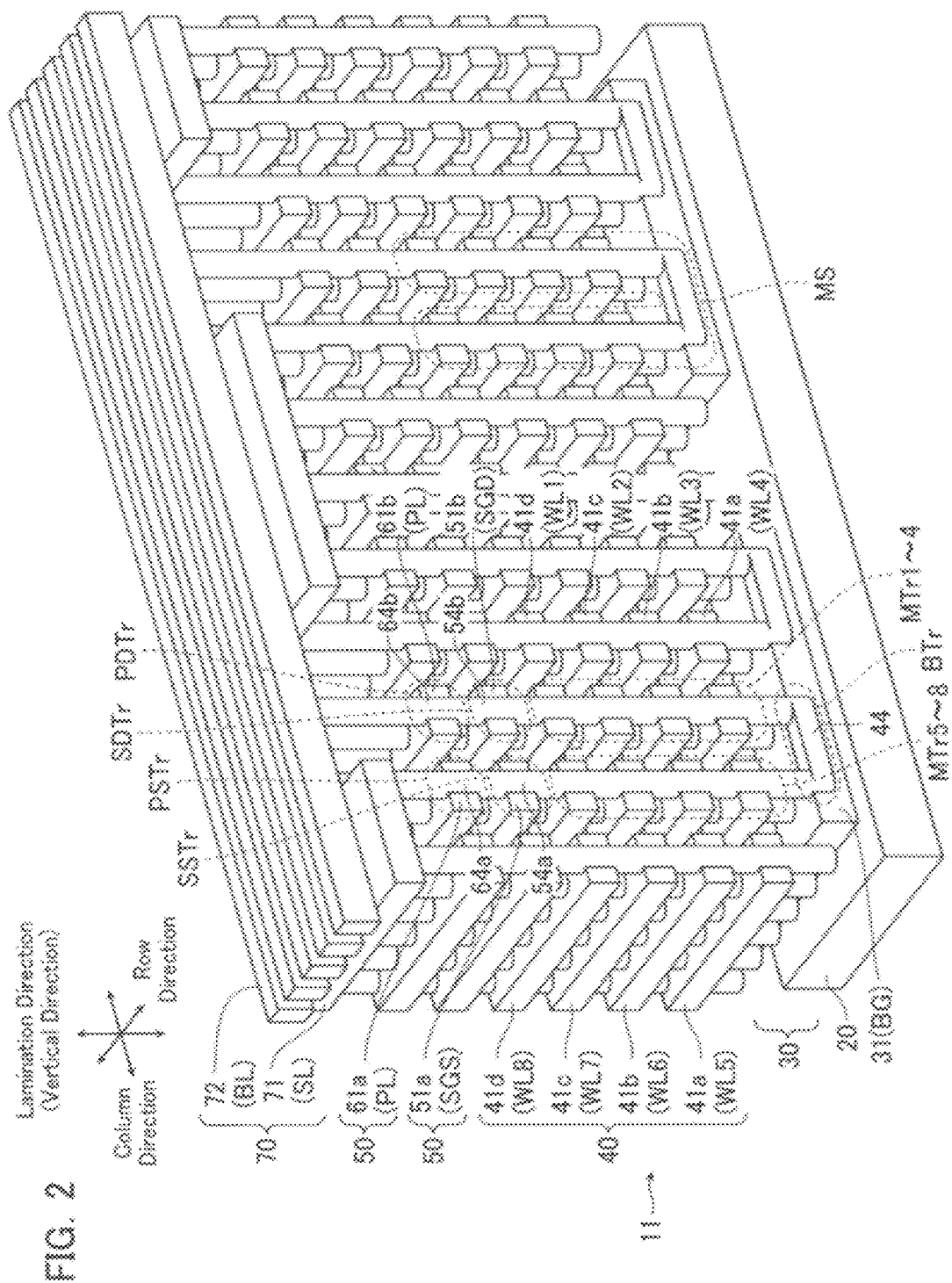
FIG. 2 is a perspective view illustrating a lamination structure of a memory cell array 11 according to the first embodiment.

Referring now to FIG. 2, a structure of the memory cell array 11 will be described below. As illustrated in FIG. 2, the memory cell array 11 includes memory transistors MTr1 to 8 for electrically storing data arranged in a three-dimensional matrix form. That is, the memory transistors MTr1 to 8 are arranged in a matrix form in a horizontal direction, and also arranged in a lamination direction (in a vertical direction to the substrate). A plurality of memory transistors MTr1 to 8 aligned in the lamination direction as well as a back-gate transistor BTr are connected in series in a U-shape, as viewed from the horizontal direction. They are included in a memory string MS. Each memory string MS is arranged with the lamination direction taken as its longitudinal direction. Connected to each end of the memory string MS are a drain-side select transistor SDTr and a source-side select transistor SSTr that are made conductive when selected. In addition, a drain-side carrier selection element PDTr is connected to one end of a drain-side select transistor SDTr, and a source-side carrier selection element PSTr is connected to one end of a source-side select transistor SSTr.

Each source-side carrier selection element PSTr and each drain-side carrier selection element PDTr are configured to select a majority carrier (either electrons or holes) flowing through the bodies of the memory transistors MTr1 to 8, the back-gate transistor BTr, the source-side select transistor SSTr, and the drain-side select transistor SDTr.

Additionally, as will be further described below, the gates of memory transistors MTr1 to 8 are connected to word lines WL1 to 8 extending in the row direction, respectively, as illustrated in FIG. 2. The gate of the back-gate transistor BTr is connected to a back-gate line BG. The gate of a drain-side select transistor SDTr is connected to a drain-side select gate line SGD extending in the row direction, and the gate of the source-side select transistor SSTr is connected to a source-side select gate line SGS extending in the row direction. The gate of the drain-side carrier selection element PDTr and the gate of the source-side carrier selection element PSTr are connected to respective carrier selection lines PL. One end of the drain-side carrier selection element PDTr is connected to a bit line BL extending in the column direction. One end of the source-side carrier selection element PSTr is connected to a source line SL extending in the row direction.

Figure 3:
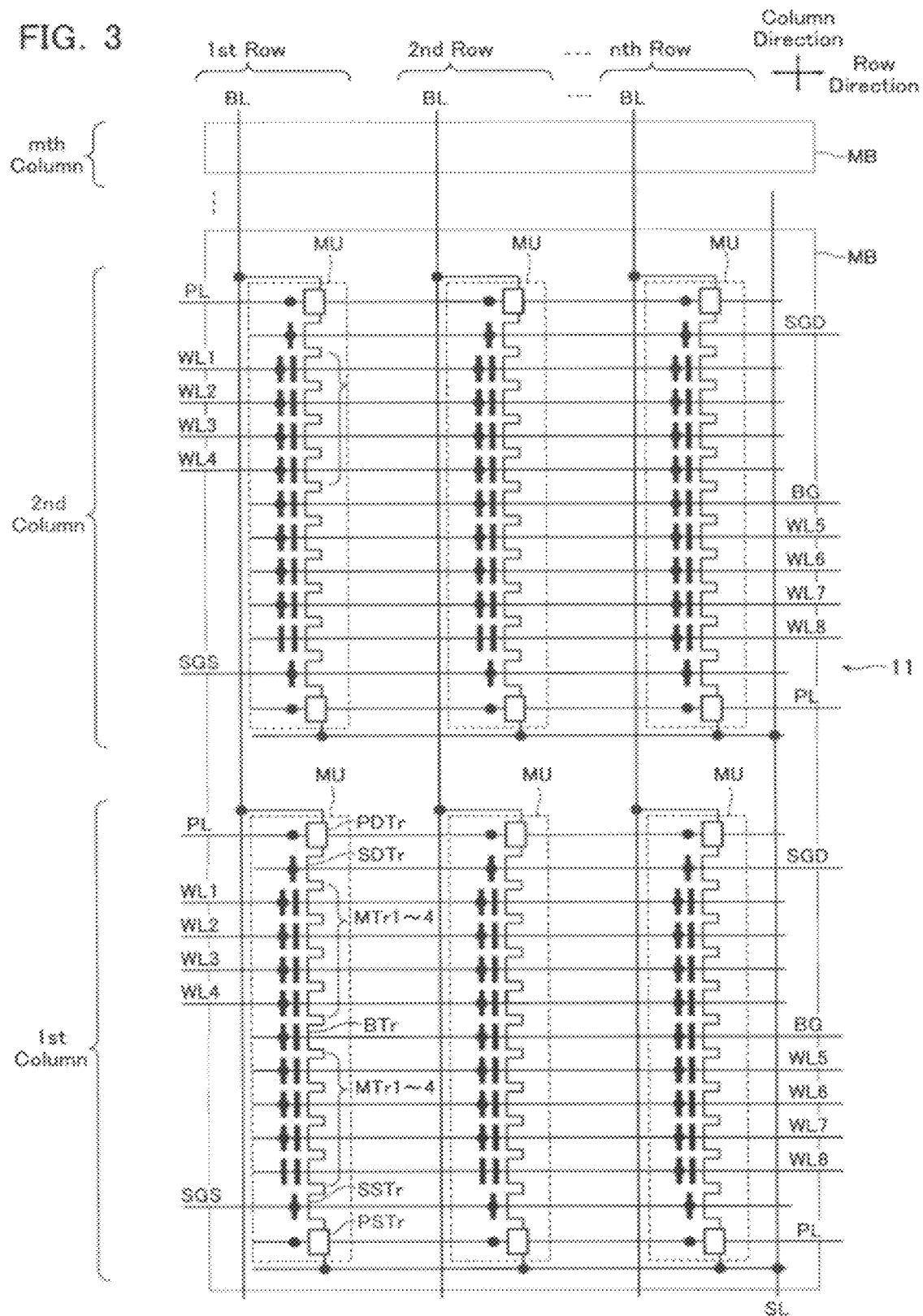
FIG. 3 is an equivalent circuit diagram of the memory cell array 11 according to the first embodiment.
Figure 4:
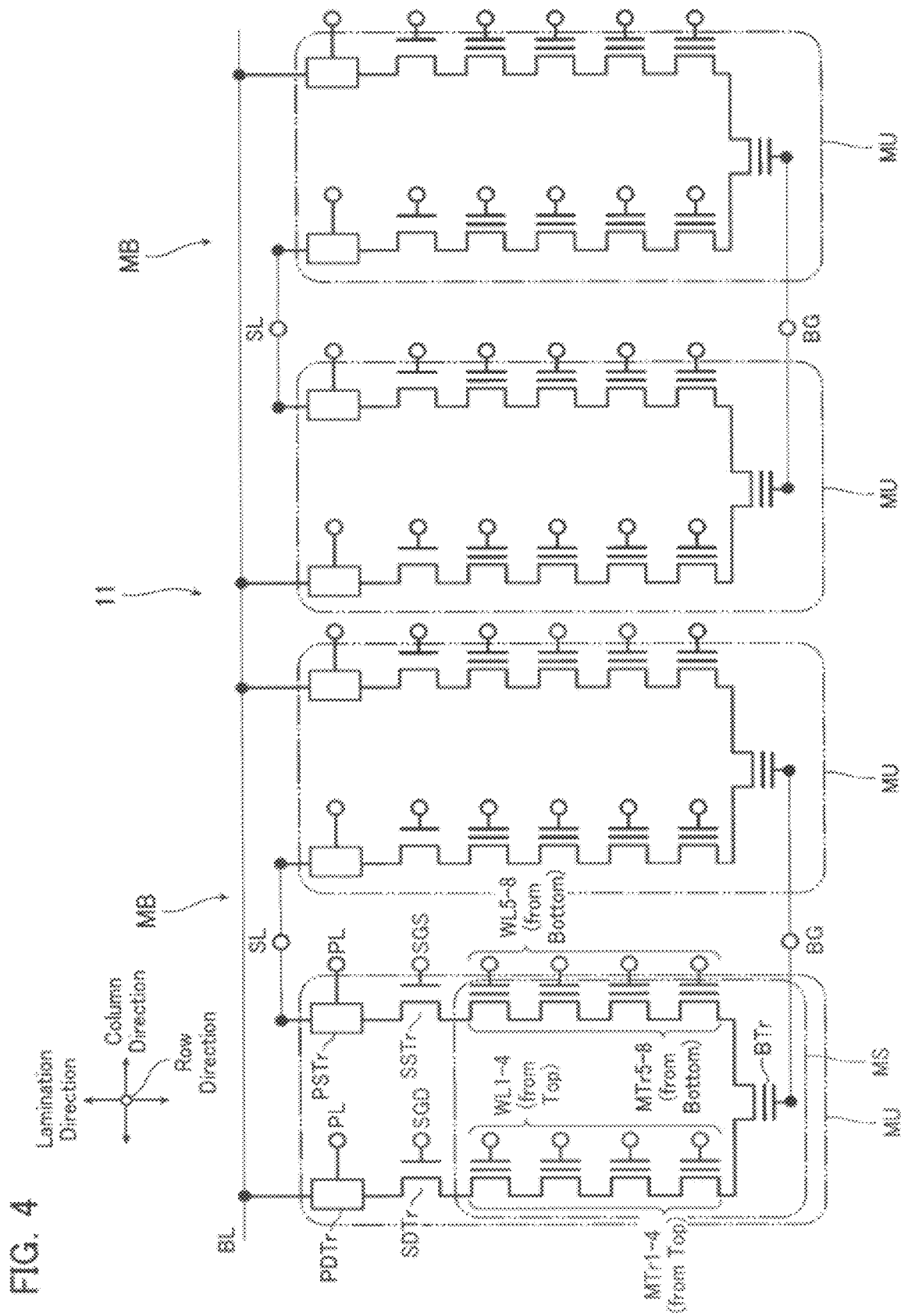
FIG. 4 is an enlarged view of FIG. 3.

Referring now to FIGS. 3 and 4, an equivalent circuit of the memory cell array 11 will be described below. As illustrated in FIG. 3, the memory cell array 11 has m columns of memory blocks MB and n rows of bit lines BL. The memory blocks are repeatedly provided at a certain pitch in the column direction. The bit lines BL are arranged at a certain pitch in the row direction, and extend with the column direction taken as its longitudinal direction.

As illustrated in FIG. 3, each of the m columns of memory blocks MB has n rows and 2 columns of memory units MU. Each memory unit MU comprises: a memory string MS; a source-side select transistor SSTr and a source-side carrier selection element PSTr connected in series to the source side of the memory string MS; and a drain-side select transistor SDTr and a drain-side carrier selection element PDTr connected in series to the drain side of the memory string MS.

As illustrated in FIGS. 3 and 4, each memory string MS includes memory transistors MTr1 to 8 and a back-gate transistor BTr connected in series. The memory transistors MTr1 to 4 are connected in series in the lamination direction. Similarly, the memory transistors MTr5 to 8 are also connected in series in the lamination direction. The memory transistors MTr1 to 8 have threshold voltages varying with changes in the amount of electric charges accumulated in their electric charge accumulation layers. The data retained by the memory transistors MTr1 to 8 can then be rewritten by changing these threshold voltages. Each back-gate transistor BTr is connected between the memory transistor MTr4 and the memory transistor MTr5 in the bottom layer in the lamination direction. Accordingly, memory transistors MTr1 to MTr8 and the back-gate transistor BTr are connected in a U-shape at a cross-section along the column direction.

As illustrated in FIG. 3, the drain of a source-side select transistor SSTr is connected to one end of the memory string MS (the source of the memory transistor MTr8). The source of the drain-side select transistor SDTr1 is connected to the other end of a memory string MS (the drain of a memory transistor MTr1).

As illustrated in FIG. 3, the drain of the source-side carrier selection element PSTr is connected to the source of the source-side select transistor SSTr, which source in turn is connected to the source line SL. The source of the drain-side carrier selection element PDTr is connected to the drain of a drain-side select transistor SDTr, which drain in turn is connected to the bit line BL.

As described above, each source-side carrier selection element PSTr and each drain-side carrier selection element PDTr select a majority carrier (either electrons or holes) flowing through the bodies of the memory transistors MTr1 to 8, the back-gate transistor BTr, the source-side select transistor SSTr, and the drain-side select transistor SDTr. Each source-side carrier selection element PSTr and each drain-side carrier selection element PDTr have holes as the majority carrier when a negative voltage is applied to their gates, while having electrons as the majority carrier when a positive voltage is applied to their gates. That is, the source-side carrier selection elements PSTr and the drain-side carrier selection elements PDTr are different from a transistor in that they allow a current to flow therein irrespective of the magnitude of voltages applied to their gates.

As illustrated in FIG. 3, the gates of n memory transistors MTr1 that are arranged in line in the row direction are commonly connected to one word line WL1 extending in the row direction. Similarly, the gates of n memory transistors MTr2 to 8 that are arranged in line in the row direction are each commonly connected to a respective one of word lines WL2 to 8 extending in the row direction. In addition, the gates of 2×n back-gate transistors BTr that are arranged in a matrix form in the row and column directions are commonly connected to one back-gate line BG.

As illustrated in FIG. 3, the gates of n source-side select transistors SSTr that are arranged in line in the row direction are commonly connected to one source-side select gate line SGS extending in the row direction. Similarly, the gates of n drain-side select transistors SDTr that are arranged in line in the row direction are commonly connected to one drain-side select gate line SGD extending in the row direction.

The gates of 2×n source-side carrier selection elements PSTr and drain-side carrier selection elements PDTr that are arranged in a matrix form in the row and column directions are commonly connected to one carrier selection line PL, as illustrated in FIG. 3.

Figure 5:
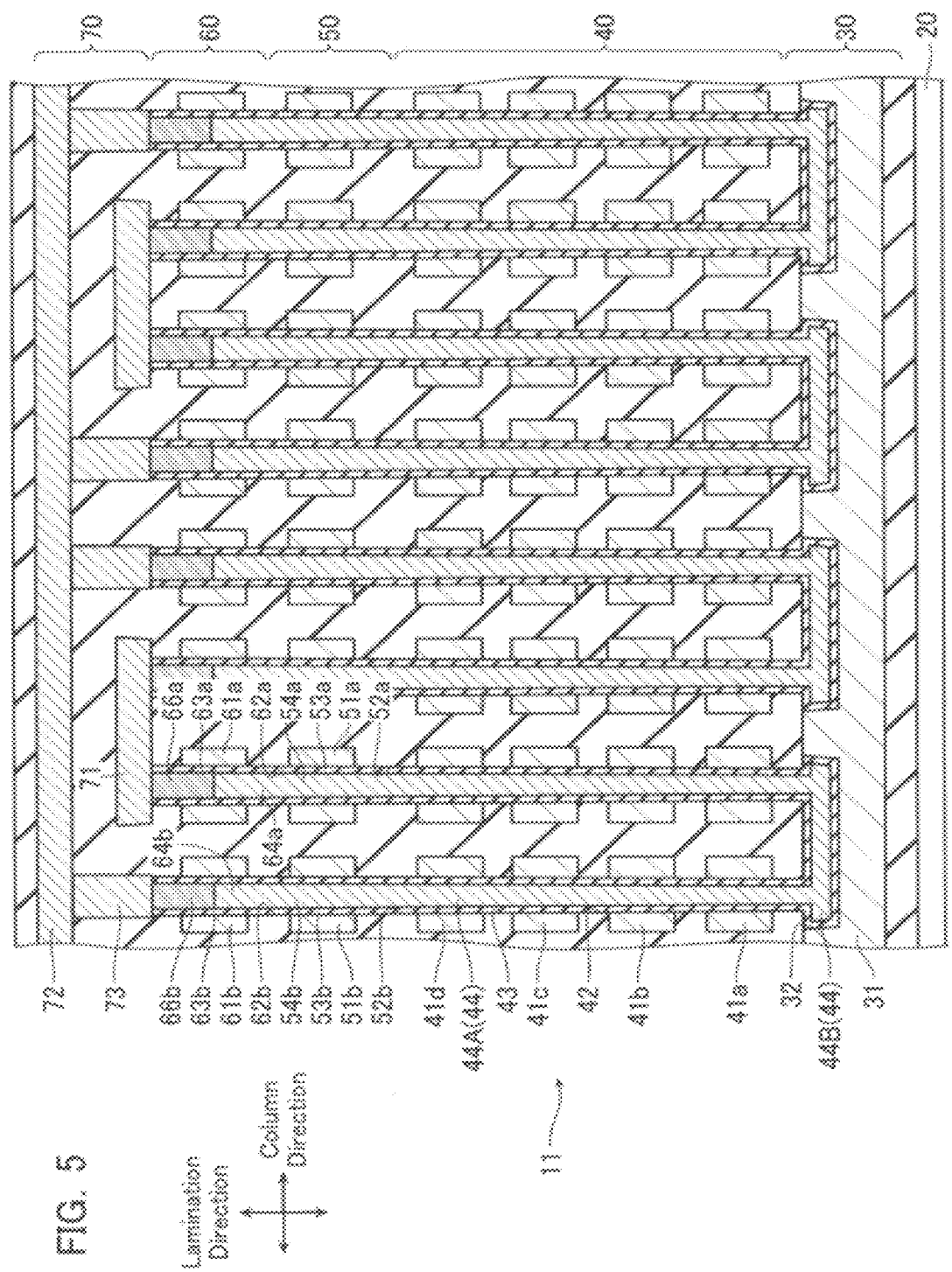
FIG. 5 is a cross-sectional view of the memory cell array 11 according to the first embodiment.
Figure 6:
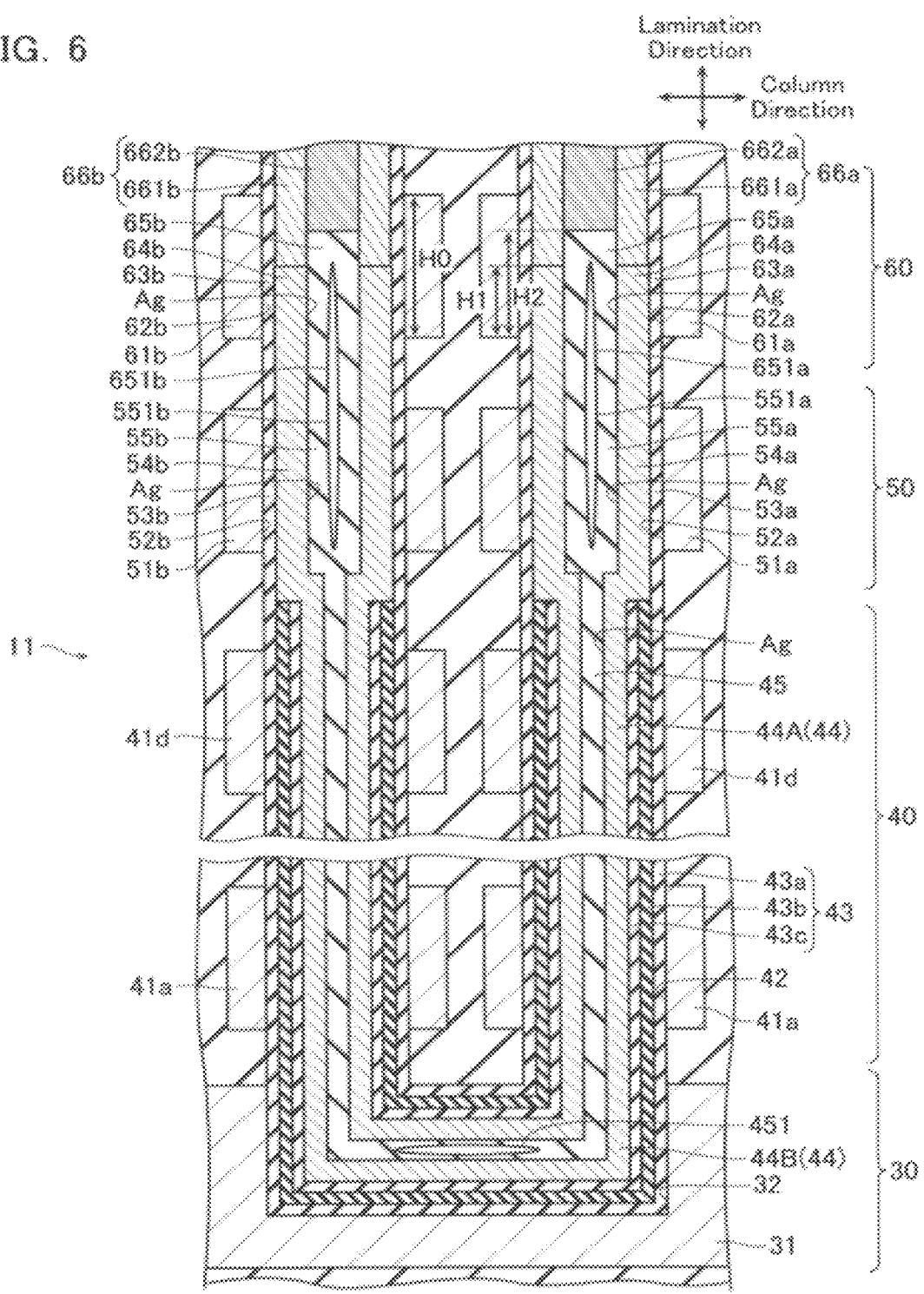
FIG. 6 is enlarged view of FIG. 5.

Referring now to FIGS. 5 and 6, a lamination structure of the non-volatile semiconductor storage device according to the first embodiment will be described below. FIG. 5 is a cross-sectional view of the memory cell array 11; and FIG. 6 is a partial enlarged view of FIG. 5.

As illustrated in FIG. 5, the memory cell array 11 has a back-gate transistor layer 30, a memory transistor layer 40, a select transistor layer 50, a carrier selection layer 60, and a wiring layer 70 on a substrate 20. The back-gate transistor layer 30 functions as the back-gate transistors BTr. The memory transistor layer 40 functions as the memory transistors MTr1 to 8 (the memory string MS). The select transistor layer 50 functions as the source-side select transistors SSTr and the drain-side select transistors SDTr. The carrier selection layer 60 functions as the source-side carrier selection elements PSTr and the drain-side carrier selection elements PDTr. The wiring layer 70 functions as the source lines SL and the bit lines BL.

As illustrated in FIG. 5, the back-gate transistor layer 30 has back-gate conductive layers 31. Each back-gate conductive layer 31 functions as the back-gate line BG as well as the gates of the back-gate transistors BTr.

Each back-gate conductive layer 31 is formed to expand in a two-dimensional manner in the row and column directions parallel to the substrate 20. The back-gate conductive layers 31 are separated in the memory blocks MB. The back-gate conductive layers 31 comprise polysilicon (poly-Si).

As illustrated in FIG. 5, the back-gate transistor layer 30 has back-gate holes 32. Each back-gate hole 32 is formed to dig into the back-gate conductive layer 31. Each back-gate hole 32 is formed in a substantially rectangular shape, as viewed from above, with the column direction taken as its longitudinal direction. The back-gate holes 32 are formed in a matrix form in the row and column directions.

As illustrated in FIG. 5, the memory transistor layer 40 is formed above the back-gate transistor layer 30. The memory transistor layer 40 has word-line conductive layers 41a to 41d. The word-line conductive layers 41a to 41d function as the word lines WL1 to 8 as well as the gates of the memory transistors MTr1 to 8, respectively.

The word-line conductive layers 41a to 41d are laminated with interlayer insulation layers sandwiched therebetween. The word-line conductive layers 41a to 41d are formed at a certain pitch in the column direction so as to extend with the row direction taken as its longitudinal direction. The word-line conductive layers 41a to 41d comprise polysilicon (poly-Si).

As illustrated in FIG. 5, the memory transistor layer 40 has memory holes 42. Each memory hole 42 is formed to penetrate the word-line conductive layers 41a to 41d and the interlayer insulation layers. Each memory hole 42 is formed to align with a back-gate hole 32 nearly at its column-direction ends.

In addition, as illustrated in FIG. 6, the back-gate transistor layer 30 and the memory transistor layer 40 have memory gate insulation layers 43, memory semiconductor layers 44, and inner insulation layers 45. Each memory semiconductor layer 44 functions as the body of the memory transistors MTr1 to MTr8 (the memory string MS).

As illustrated in FIG. 6, each memory gate insulation layer 43 is formed with a certain thickness on the side surfaces of the back-gate hole 32 and the memory hole 42. Each memory gate insulation layer 43 has a block insulation layer 43a, an electric charge accumulation layer 43b, and a tunnel insulation layer 43c. The threshold voltages of the memory transistors MTr1 to 8 change as electric charges are accumulated in an electric charge accumulation layer 43b, which allows for rewriting of the data retained by the memory transistors MTr.

As illustrated in FIG. 6, each block insulation layer 43a is formed with a certain thickness on the side surfaces of the back-gate hole 32 and the memory hole 42. Each electric charge accumulation layer 43b is formed with a certain thickness on the side surface of the block insulation layer 43a. Each tunnel insulation layer 43c is formed with a certain thickness on the side surface of the electric charge accumulation layer 43b. The block insulation layers 43a and the tunnel insulation layers 43c comprise silicon oxide ($SiO_2$). The electric charge accumulation layers 43b comprise silicon nitride (SiN).

Each memory semiconductor layer 44 is formed with a certain thickness on the tunnel insulation layer 43c. Each memory semiconductor layer 44 has a hollow Ag, and is formed in a U-shape, as viewed from the row direction. Each memory semiconductor layer 44 has a pair of columnar portions 44A extending in the vertical direction to the substrate 20, and a joining portion 44B joining the lower ends of the pair of columnar portions 44A. Each memory semiconductor layer 44 comprises polysilicon (poly-Si).

Each inner insulation layer 45 is formed to fill up the hollow Ag of the memory semiconductor layer 44. Each inner insulation layer 45 comprises silicon nitride (SiN). Each inner insulation layer 45 has an air gap 451 within itself.

The above-mentioned configuration of the back-gate transistor layer 30 is restated as: each back-gate conductive layer 31 is formed to surround the joining portion 44B via the memory gate insulation layer 43. In addition, the configuration of the memory transistor layer 40 is restated as: the word-line conductive layers 41a to 41d are formed to surround the columnar portions 44A via the memory gate insulation layer 43.

As illustrated in FIG. 5, the select transistor layer 50 has source-side conductive layers 51a and drain-side conductive layers 51b. Each source-side conductive layer 51a functions as the source-side select gate line SGS as well as the gate of the source-side select transistor SSTr. Each drain-side conductive layer 51b functions as the drain-side select gate line SGD as well as the gate of the drain-side select transistor SDTr.

Each source-side conductive layer 51a is formed above one columnar portion 44A included in a memory semiconductor layer 44. Each drain-side conductive layer 51b is located in the same layer as each source-side conductive layer 51a, and is formed above the other columnar portion 44A included in the memory semiconductor layer 44. The source-side conductive layers 51a and the drain-side conductive layers 51b are formed in a stripe pattern extending in the row direction at a certain pitch in the column direction. The source-side conductive layers 51a and the drain-side conductive layers 51b comprise polysilicon (poly-Si).

As illustrated in FIG. 5, the select transistor layer 50 has source-side holes 52a and drain-side holes 52b. Each source-side hole 52a is formed to penetrate the source-side conductive layer 51a and the interlayer insulation layer. Each drain-side hole 52b is formed to penetrate the drain-side conductive layer 51b and the interlayer insulation layer. Each source-side hole 52a and each drain-side hole 52b are formed at respective positions matching the corresponding memory hole 42.

As illustrated in FIG. 6, the select transistor layer 50 has source-side gate insulation layers 53a, source-side columnar semiconductor layers 54a, and internal insulation layers 55a. Each source-side columnar semiconductor layer 54a functions as the body of the source-side select transistor. SSTr.

Each source-side gate insulation layer 53a is formed with a certain thickness on the side surface of the source-side hole 52a. Each source-side gate insulation layer 53a comprises silicon oxide ($SiO_2$).

Each source-side columnar semiconductor layer 54a is formed with a certain thickness on the side surface of the source-side gate insulation layer 53a. Each source-side columnar semiconductor layer 54a has a hollow Ag, and is formed in a columnar shape extending in the lamination direction from the top surface of the columnar portion 44A. Each source-side columnar semiconductor layer 54a comprises polysilicon (poly-Si).

Each internal insulation layer 55a is formed to fill up the hollow Ag of the source-side columnar semiconductor layer 54a. Each internal insulation layer 55a is formed in a columnar shape extending in the lamination direction. Each internal insulation layer 55a comprises silicon nitride (SiN). Each internal insulation layer 55a has an air gap 551a within itself.

In addition, as illustrated in FIG. 6, the select transistor layer 50 has drain-side gate insulation layers 53b, drain-side columnar semiconductor layers 54b, and internal insulation layers 55b. Each drain-side columnar semiconductor layer 54b functions as the body of the drain-side select transistor SDTr.

Each drain-side gate insulation layer 53b is formed with a certain thickness on the side surface of the drain-side hole 52b. Each drain-side gate insulation layer 53b comprises silicon oxide ($SiO_2$).

Each drain-side columnar semiconductor layer 54b is formed with a certain thickness on the side surface of the drain-side gate insulation layer 53b. Each drain-side columnar semiconductor layer 54b has a hollow Ag, and is formed in a columnar shape extending in the lamination direction from the top surface of the columnar portion 44A. Each drain-side columnar semiconductor layer 54b comprises polysilicon (poly-Si).

Each internal insulation layer 55b is formed to fill up the hollow Ag of the drain-side columnar semiconductor layer 54b. Each internal insulation layer 55b is formed in a columnar shape extending in the lamination direction. Each internal insulation layer 55b comprises silicon nitride (SiN). Each internal insulation layer 55b has an air gap 551b within itself.

As illustrated in FIG. 5, the carrier selection layer 60 has source-side conductive layers 61a and drain-side conductive layers 61b. Each source-side conductive layer 61a functions as the carrier selection line PL as well as the gate of the source-side carrier selection element PSTr. Each drain-side conductive layer 61b functions as the carrier selection line PL as well as the gate of the drain-side carrier selection element PDTr.

The source-side conductive layers 61a are formed above the source-side conductive layers 51a. The drain-side conductive layers 61b are located in the same layer as the source-side conductive layers 61a, and are formed above the drain-side conductive layers 51b. The source-side conductive layers 61a and the drain-side conductive layers 61b comprise polysilicon (poly-Si).

As illustrated in FIG. 5, the carrier selection layer 60 has source-side holes 62a and drain-side holes 62b. Each source-side hole 62a is formed to penetrate the source-side conductive layer 61a and the interlayer insulation layer, while each drain-side hole 62b is formed to penetrate the drain-side conductive layer 61b and the interlayer insulation layer. Each source-side hole 62a and each drain-side hole 62b are formed at respective positions matching the corresponding source-side hole 52a and drain-side hole 52b.

As illustrated in FIG. 6, the carrier selection layer 60 has source-side gate insulation layers 63a, source-side columnar semiconductor layers 64a, internal insulation layers 65a, and metal layers 66a. Each source-side columnar semiconductor layer 64a functions as the body of the source-side carrier selection element PSTr.

Each source-side gate insulation layer 63a is formed with a certain thickness on the side surface of the source-side hole 62a. Each source-side gate insulation layer 63a comprises silicon oxide ($SiO_2$).

Each source-side columnar semiconductor layer 64a is formed with a certain thickness on the side surface of the source-side gate insulation layer 63a. Each source-side columnar semiconductor layer 64a has a hollow Ag, and is formed in a columnar shape extending in the lamination direction from the top surface of the source-side columnar semiconductor layer 54a. If each source-side conductive layer 61a has a thickness of H0 in the lamination direction, then the top surface of each source-side columnar semiconductor layer 64a is located at a height H1 (H1<H0) from the bottom surface of the source-side conductive layer 61a. Each source-side columnar semiconductor layer 64a comprises polysilicon (poly-Si).

Each internal insulation layer 65a is formed to fill up the hollow Ag of the source-side columnar semiconductor layer 64a. Each internal insulation layer 65a is formed in a columnar shape extending in the lamination direction. The top surface of each internal insulation layer 65a is located at a height H2 (H1<H2<H0) from the bottom surface of the source-side conductive layer 61a. Each internal insulation layer 65a comprises silicon nitride (SiN). Each internal insulation layer 65a has an air gap 651a within itself.

Each metal layer 66a is formed in a columnar shape extending in the lamination direction from the top surfaces of the source-side columnar semiconductor layer 64a and the internal insulation layer 65a. Each metal layer 66a has a first metal layer 661a and a second metal layer 662a.

Each first metal layer 661a is formed with a certain thickness on the side surface of the source-side gate insulation layer 63a so that it extends in the lamination direction from the top surface of the source-side columnar semiconductor layer 64a. Each first metal layer 661a is electrically connected to the source-side columnar semiconductor layer 64a. Each first metal layer 661a comprises, e.g., nickel silicide (NiSi).

Each second metal layer 662a is formed in contact with the side surface of the first metal layer 661a so as to fill up the source-side hole 62a. Each second metal layer 662a is formed in a columnar shape extending in the lamination direction from the top surface of the internal insulation layer 65a. Each second metal layer 662a comprises, e.g., tungsten (W).

As illustrated in FIG. 6, the carrier selection layer 60 has drain-side gate insulation layers 63b, drain-side columnar semiconductor layers 64b, internal insulation layers 65b, and metal layers 66b. Each drain-side columnar semiconductor layer 64b functions as the body of the drain-side carrier selection element PDTr.

Each drain-side gate insulation layer 63b is formed with a certain thickness on the side surface of the drain-side hole 62b. Each drain-side gate insulation layer 63b comprises silicon oxide (SiO$_2$).

Each drain-side columnar semiconductor layer 64b is formed with a certain thickness on the side surface of the drain-side gate insulation layer 63b. Each drain-side columnar semiconductor layer 64b has a hollow Ag, and is formed in a columnar shape extending in the lamination direction from the top surface of the drain-side columnar semiconductor layer 54b. If each drain-side conductive layer 61b has a thickness of H0 in the lamination direction, then the top surface of each drain-side columnar semiconductor layer 64b is located at a height H1 (H1<H0) from the bottom surface of the drain-side conductive layer 61b. Each drain-side columnar semiconductor layer 64b comprises polysilicon (poly-Si).

Each internal insulation layer 65b is formed to fill up the hollow Ag of the drain-side columnar semiconductor layer 64b. Each internal insulation layer 65b is formed in a columnar shape extending in the lamination direction. The top surface of each internal insulation layer 65b is located at a height H2 (H1<H2<H0) from the bottom surface of the drain-side conductive layer 61b. Each internal insulation layer 65b comprises silicon nitride (SiN). Each internal insulation layer 65b has an air gap 651b within itself.

Each metal layer 66b is formed in a columnar shape extending in the lamination direction from the top surfaces of the drain-side columnar semiconductor layer 64b and the internal insulation layer 65b. Each metal layer 66b has a first metal layer 661b and a second metal layer 662b.

Each first metal layer 661b is formed with a certain thickness on the side surface of the drain-side gate insulation layer 63b sc that it extends in the lamination direction from the top surface of the drain-side columnar semiconductor layer 64b. Each first metal layer 661b is in ohmic contact with the drain-side columnar semiconductor layer 64b. Each first metal layer 661b comprises, e.g., nickel silicide (NiSi).

Each second metal layer 662b is formed in contact with the side surface of a first metal layer 661b so as to fill up the drain-side hole 62b. Each second metal layer 662b is formed in a columnar shape extending in the lamination direction from the top surface of the internal insulation layer 65b. Each second metal layer 662b comprises, e.g., tungsten (W).

As illustrated in FIG. 5, the wiring layer 70 is formed above the carrier selection layer 60. The wiring layer 70 has source-line layers 71 and bit-line layers 72. Each source-line layer 71 functions as the source line SL. Each bit-line layer 72 functions as the bit line BL.

Each source-line layer 71 is formed in a plate-like shape extending in the row direction. Each source-line layer 71 is formed in contact with the top surfaces of a pair of source-side columnar semiconductor layers 64a adjacent in the column direction. Each bit-line layer 72 is formed in contact with the top surface of the drain-side columnar semiconductor layer 64b via a plug layer 73. The bit-line layers 72 are formed in a stripe pattern extending in the column direction at a certain pitch in the row direction. The source-line layers 71, bit-line layers 72, and plug layers 73 comprise metal such as tungsten (W).

Figure 7:
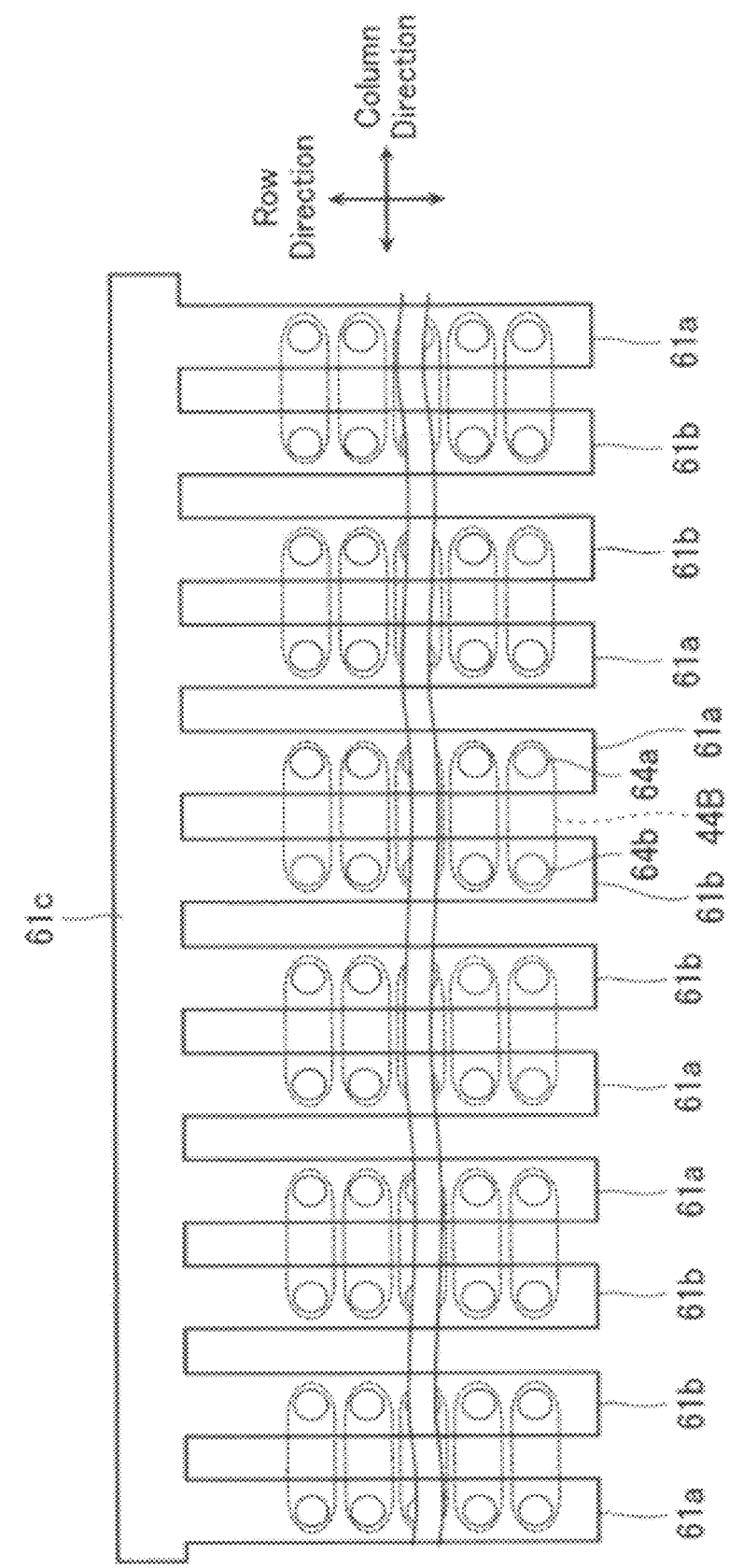
FIG. 7 is a top plan view illustrating source-side conductive layers 61a and drain-side conductive layers 61b according to the first embodiment.

Referring now to FIG. 7, the shape of source-side conductive layers 61a and drain-side conductive layers 61b will be described in detail below. FIG. 7 is a top plan view illustrating the source-side conductive layers 61a and the drain-side conductive layers 61b.

As illustrated in FIG. 7, the source-side conductive layers 61a and the drain-side conductive layers 61b are joined together by a joining layer 61c at their row-direction ends. The source-side conductive layers 61a, the drain-side conductive layers 61b, and the joining layer 61c are formed in a comb-teeth shape in relation to each other, as viewed from the lamination direction. That is, the source-side conductive layers 61a, the drain-side conductive layers 61b, and the joining layer 61c are integrally formed so as to surround a plurality of source-side columnar semiconductor layers 64a, drain-side columnar semiconductor layers 64b, and metal layers 66a, 66b that are arranged in a matrix form.

[Operation]

Figure 8:
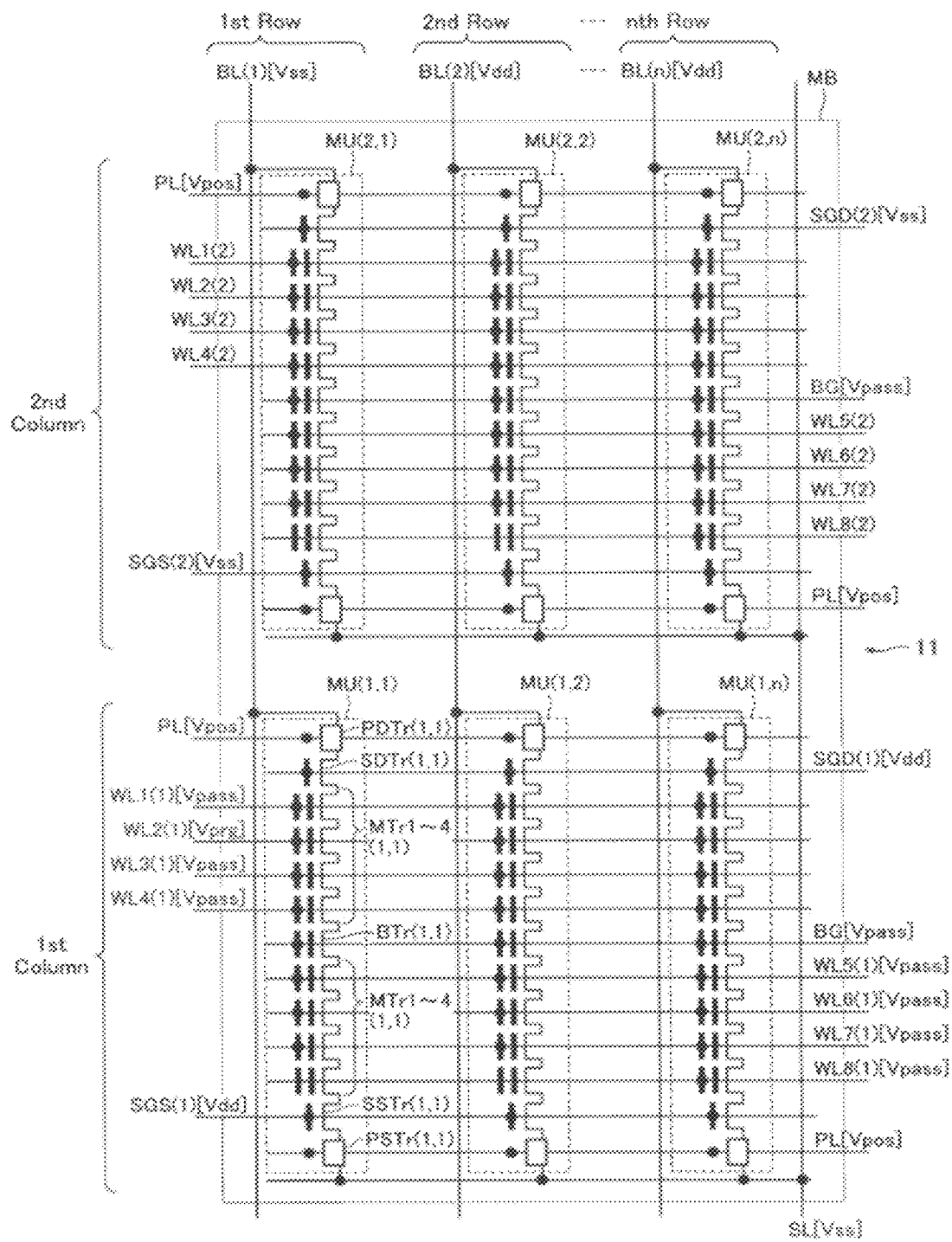
FIG. 8 is a circuit diagram illustrating a write operation in the first embodiment.

Referring now to FIG. 8, a write operation of the nonvolatile semiconductor storage device according to the first embodiment will be described below. In FIG. 8, as one example, consider that a write operation is performed on a memory block. MB selected from a plurality of memory blocks MB. More specifically, the description will be made on an exemplary case where a write operation is performed on a memory transistor MTr2(1,1) that is included in a memory unit MU(1,1) positioned at the first row and first column of one memory block MB.

As illustrated in FIG. 8, the control circuit 12 applies a positive voltage Vpos to the carrier selection lines PL. As a result, electrons are accumulated in the bodies of a drain-side carrier selection element PDTr and a source-side carrier selection element PSTr. Thus, the electrons become dominant as the majority carrier flowing through the bodies of the memory transistors MTr1 to 8, the drain-side select transistor SDTr, and the source-side select transistor SSTr. Consequently, the memory transistors MTr1 to 8, the back-gate transistors BTr, the source-side select transistor SSTr, and the drain-side select transistor SDTr serve as NMOS transistors.

Then, as illustrated in FIG. 8, the control circuit 12 applies a ground voltage Vss to the bit line BL(1) in the first row, while applying a power supply voltage Vdd (1.2V) to the bit line BLs(2) to (n) in the second to $n^{th}$ rows. In addition, the control circuit 12 applies the ground voltage Vss to the source line SL. Furthermore, the control circuit 12 applies the power supply voltage Vdd to the source-side select gate line SGS(1) and the drain-side select gate line SGD(1) in the first column, while applying the ground voltage Vss to the source-side select gate line SGS(2) and the drain-side select gate line SGD(2) in the second column. The control circuit 12 applies a positive pass voltage Vpass (e.g., 10V) to the word lines WL1(1) and 3(1) to 8(1) in the first column, while applying a positive program voltage Vprg (e.g., 18V) to the word line WL2(1) in the first column. The control circuit 12 applies the positive pass voltage Vpass to the back-gate line BG.

Through this voltage control, the control circuit 12 accumulates electric charges in the charge accumulation layer of the memory transistor MTr2(1,1) to store data.

Figure 9:
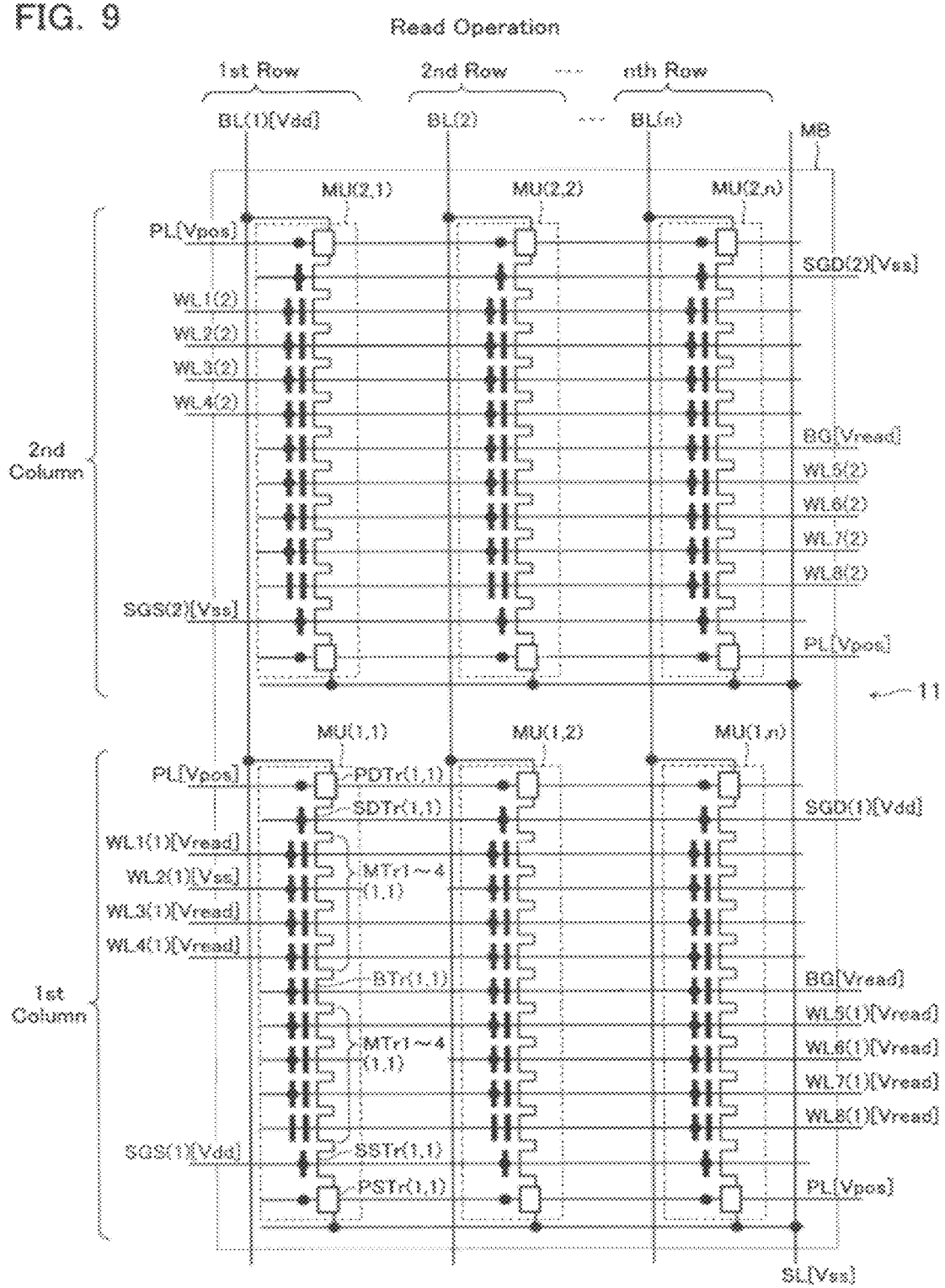
FIG. 9 is a circuit diagram illustrating a read operation in the first embodiment.

Referring now to FIG. 9, a read operation of the non-volatile semiconductor storage device according to the first embodiment will be described below. In FIG. 9, as one example, consider that a read operation is performed on a memory block MB selected from a plurality of memory blocks MB. More specifically, the description will be made on an exemplary case where a read operation is performed on a memory transistor MTr2(1,1) that is included in a memory unit MU(1,1) positioned at the first row and first column of one memory block MB.

As illustrated in FIG. 9, the control circuit 12 applies a positive voltage Vpos to the carrier selection lines PL. Consequently, as in the write operation, the memory transistors MTr1 to 8, the back-gate transistors BTr, the drain-side select transistor SDTr, and the source-side select transistor SSTr serve as NMOS transistors.

Then, as illustrated in FIG. 9, the control circuit 12 applies the power supply voltage Vdd to the bit line BL(1) in the first row. In addition, the control circuit 12 applies the ground voltage Vss to the source line SL. Furthermore, the control circuit 12 applies the power supply voltage Vdd to the source-side select gate line SGS(1) and the drain-side select gate line SGD(1) in the first column, while applying the ground voltage Vss to the source-side select gate line SGS(2) and the drain-side select gate line SGD(2) in the second column. The control circuit 12 applies a positive read voltage Vread (e.g., 5V) to the word lines WL1(1) and 3(1) to 8(1) in the first column, while applying the ground voltage Vss to the word line WL2(1) in the first column. The control circuit 12 applies the positive read voltage Vread to the back-gate line BG.

Through this voltage control, the control circuit 12 detects whether or not a current flows from the bit line BL(1) into the source line SL via the memory transistor MTr2(1,1) to read data from the memory transistor MTr2(1,1).

Figure 10:
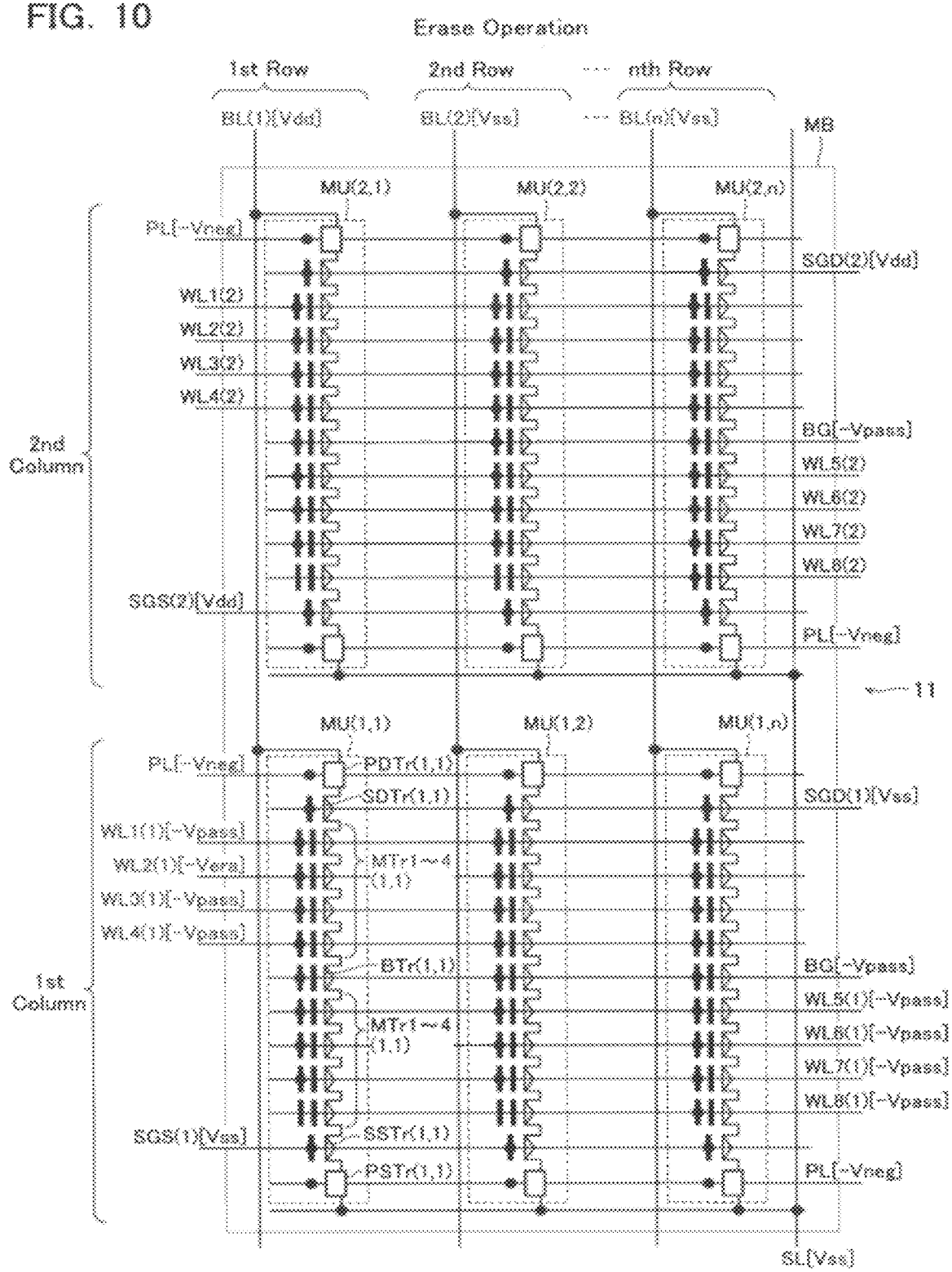
FIG. 10 is a circuit diagram illustrating an erase operation in the first embodiment.

Referring now to FIG. 10, an erase operation of the non-volatile semiconductor storage device according to the first embodiment will be described below. In FIG. 10, as one example, consider that an erase operation is performed on a memory block. MB selected from a plurality of memory blocks MB. More specifically, the description will be made on an exemplary case where an erase operation is performed on a memory transistor MTr2(1,1) that is included in a memory unit MU(1,1) positioned at the first row and first column of one memory block MB.

As illustrated in FIG. 10, the control circuit 12 applies a negative voltage −Vneg to the carrier selection lines PL. As a result, holes are accumulated in the bodies of the drain-side carrier selection element PDTr and the source-side carrier selection element PSTr. Thus, the holes become dominant as the majority carrier flowing through the bodies of the memory transistors MTr1 to 8, the drain-side select transistor SDTr, and the source-side select transistor SSTr. Consequently, the memory transistors MTr1 to 8, the back-gate transistors BTr, the source-side select transistor SSTr, and the drain-side select transistor SDTr serve as PMOS transistors.

Then, as illustrated in FIG. 10, the control circuit 12 applies the power supply voltage Vdd to the bit line BL(1) in the first row, while applying the ground voltage Vss to the bit line BLs(2) to (n) in the second to $n^{th}$ rows. In addition, the control circuit 12 applies the ground voltage Vss to the source line SL. Furthermore, the control circuit 12 applies the ground voltage Vss to the source-side select gate line SGS(1) and the drain-side select gate line SGD(1) in the first column, while applying the power supply voltage Vdd to the source-side select gate line SGS(2) and the drain-side select gate line SGD(2) in the second column. The control circuit 12 applies a negative pass voltage −Vpass (e.g., −10V) to the word lines WL1 and 3 to 8(1) in the first column, while applying a negative erase voltage −Vera (e.g., −20V) to the word line WL2(1) in the first column. The control circuit 12 applies the negative pass voltage −Vpass to the back-gate line BG.

Through this voltage control, the control circuit 12 erases the data from the memory transistor MTr2(1,1) as the electric charges accumulated in the charge accumulation layer of the memory transistor MTr2(1,1) are reduced.

[Manufacturing Method]

Referring now to FIGS. 11 to 18, a method of manufacturing the non-volatile semiconductor storage device according to the first embodiment will be described below.

Figure 11:
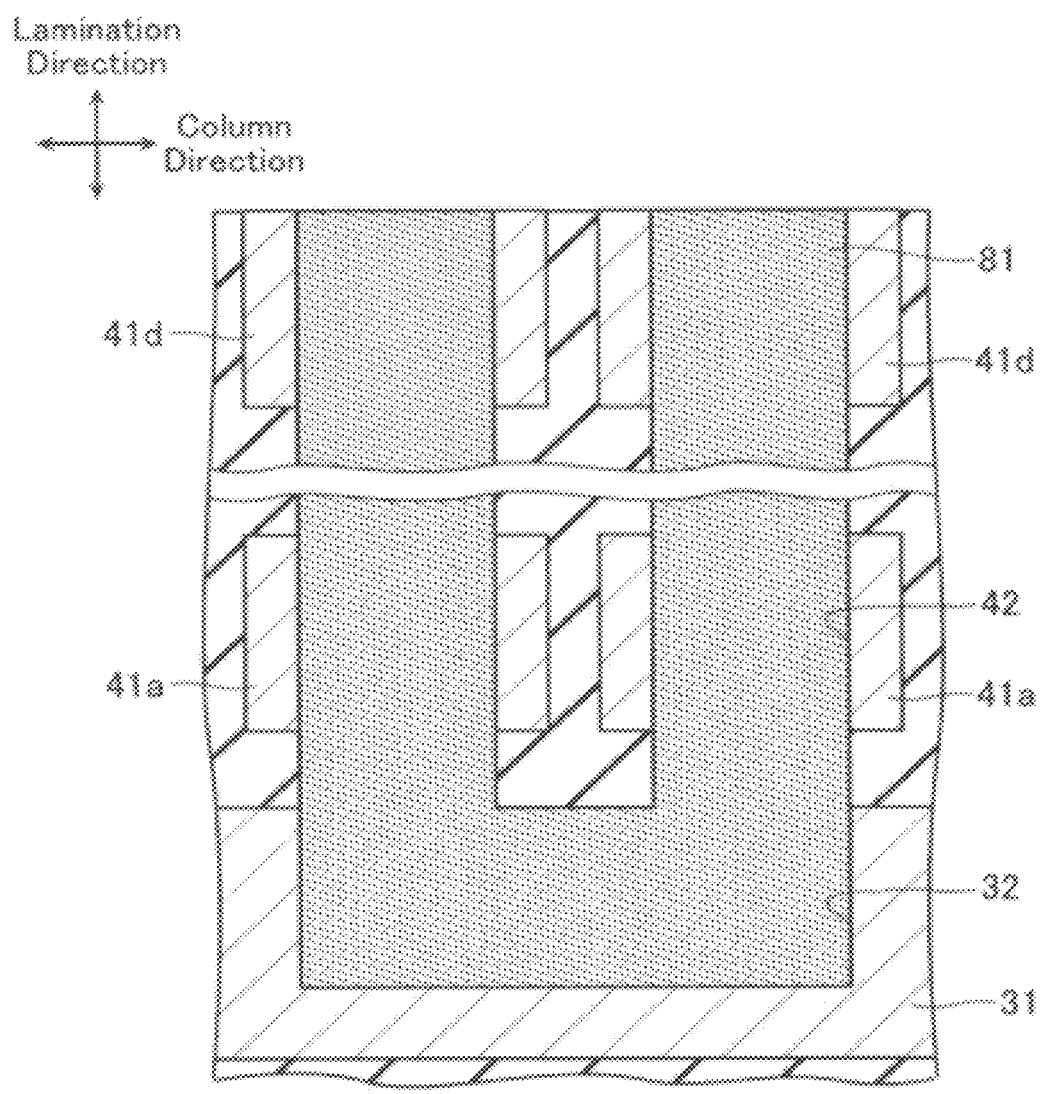
FIG. 11 is a cross-sectional view illustrating a manufacturing step of the memory cell array 11 according to the first embodiment

Firstly, as illustrated in FIG. 11, a back-gate conductive layer 31 and word-line conductive layers 41a to 41d are formed on the substrate 20. Then, a back-gate hole 32 is formed in the back-gate conductive layer 31. The back-gate hole 32 is then filled with a sacrificial film, after which a memory hole 42 is formed in the word-line conductive layers 41a to 41d. Subsequently, a sacrificial layer 81 (e.g., silicon nitride (SiN)) is formed to fill up the back-gate hole 32 and the memory hole 42.

Figure 12:
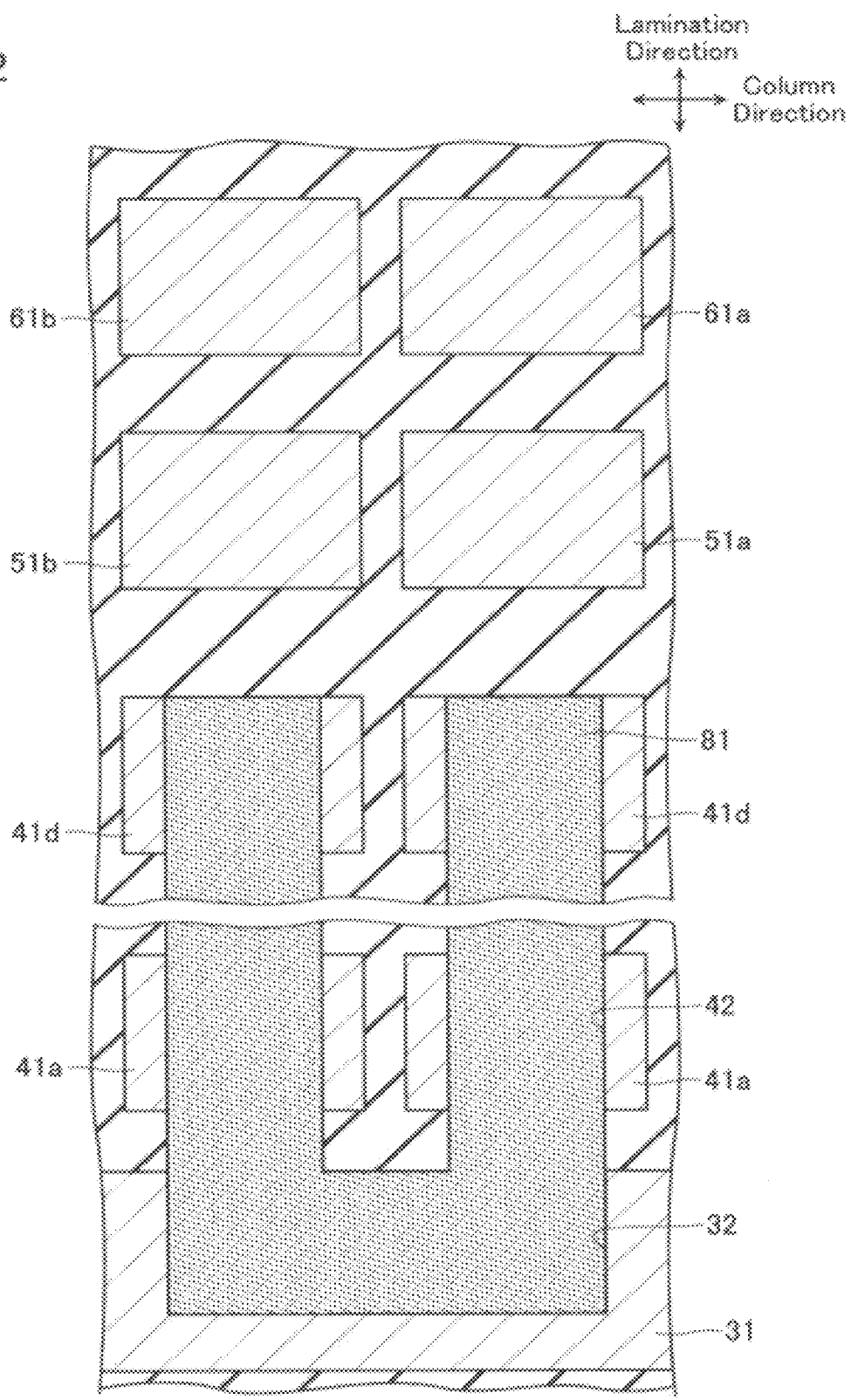
FIG. 12 is a cross-sectional view illustrating a manufacturing step of the memory cell array 11 according to the first embodiment.

Then, source-side conductive layers 51a, 61a and drain-side conductive layers 51b, 61b are formed as illustrated in FIG. 12.

Figure 13:
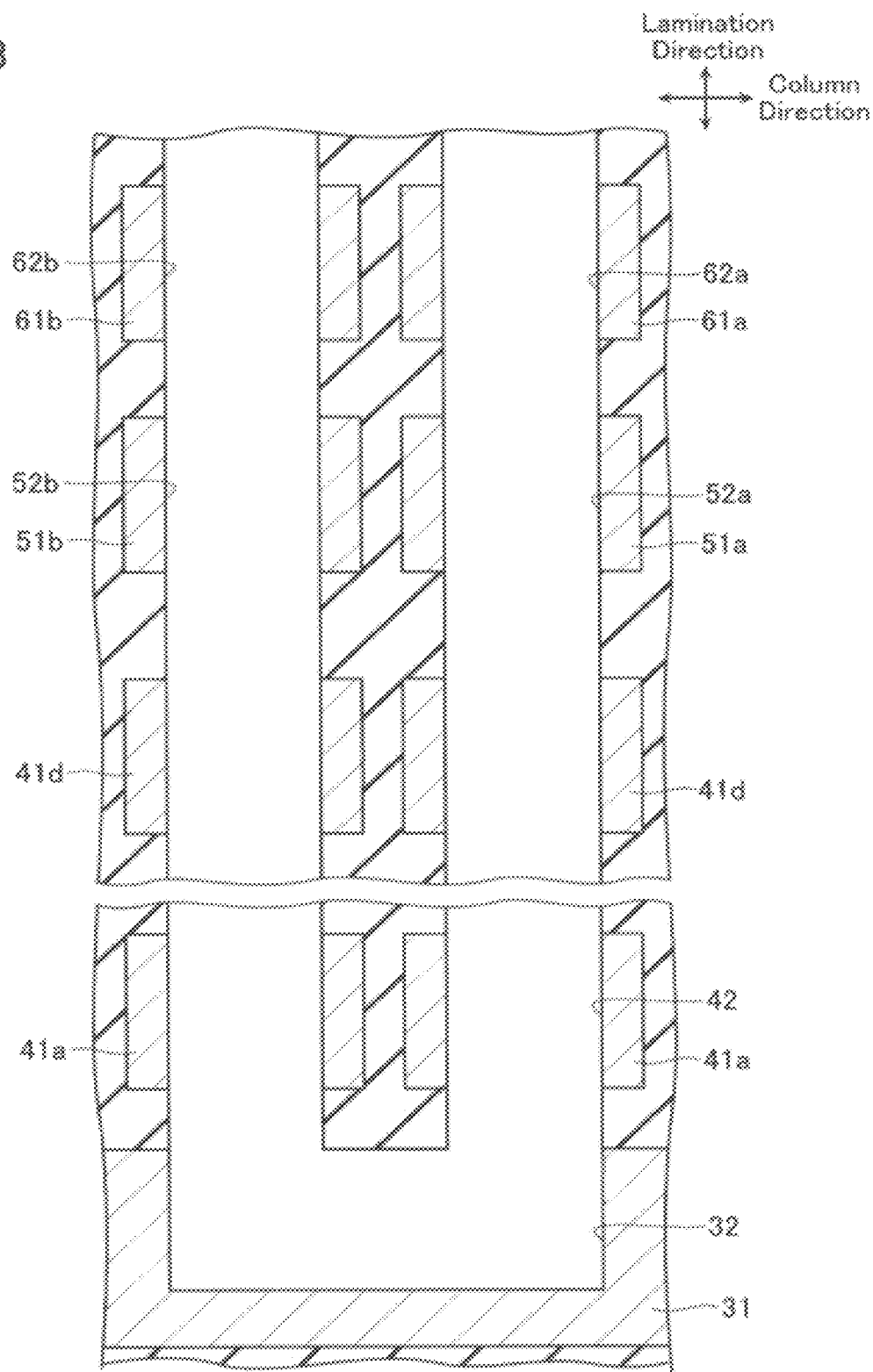
FIG. 13 is a cross-sectional view illustrating a manufacturing step of the memory cell array 11 according to the first embodiment.

Subsequently, as illustrated in FIG. 13, source-side holes 52a, 62a are formed to penetrate the source-side conductive layers 51a, 61a, while drain-side holes 52b, 62b are formed to penetrate the drain-side conductive layers 51b, 61b. Then, the sacrificial layer 81 is removed through the source-side holes 52a, 62a and the drain-side holes 52b, 62b using, for example, a hot phosphoric acid solution.

Figure 14:
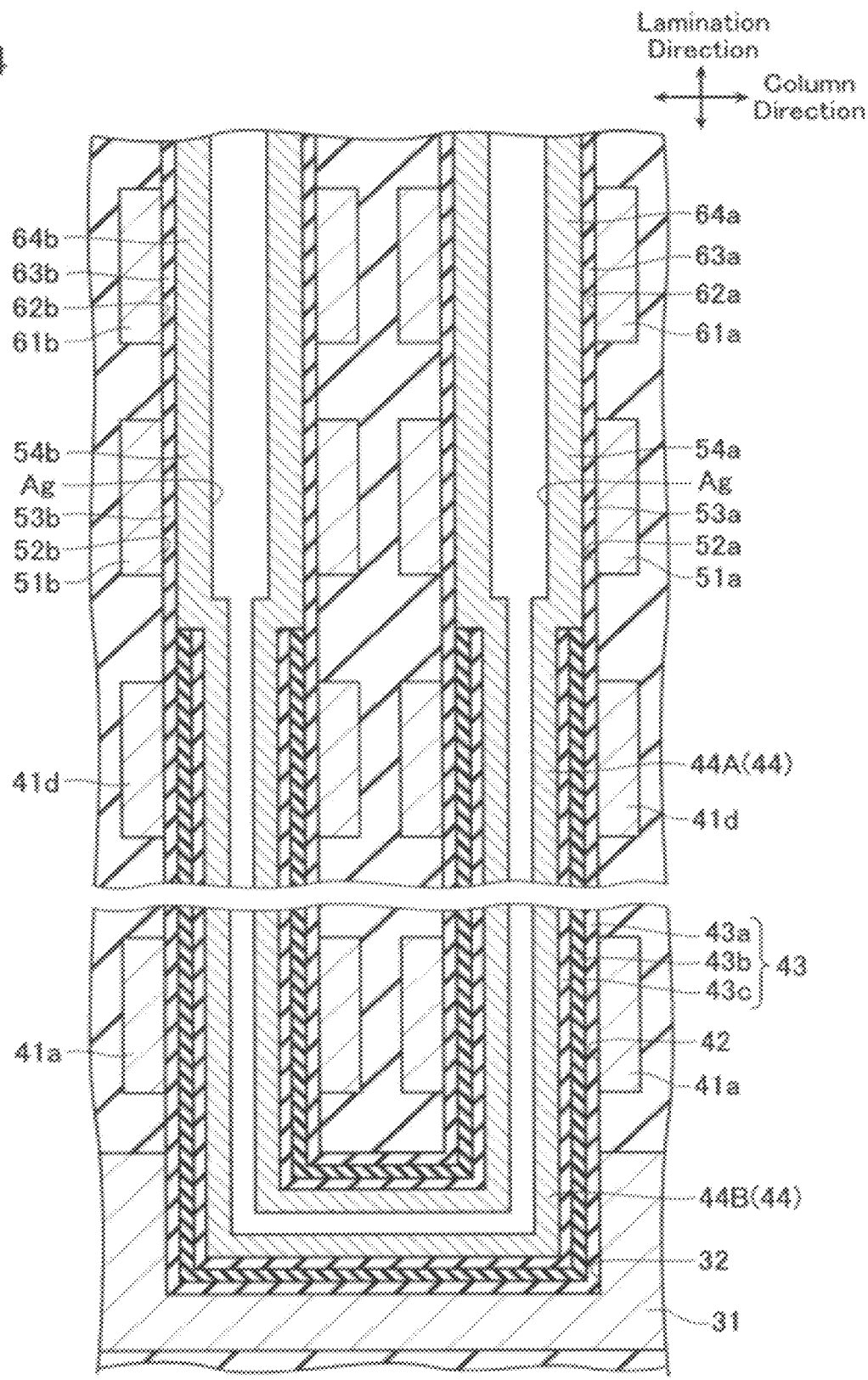
FIG. 14 is a cross-sectional view illustrating a manufacturing step of the memory cell array 11 according to the first embodiment.

Subsequently, as illustrated in FIG. 14, a memory gate insulation layer 43 is formed on the side surfaces of the back-gate hole 32 and the memory hole 42, and a memory semiconductor layer 44 is formed on the side surface of the memory gate insulation layer 43. In addition, source-side gate insulation layers 53a, 63a are formed on the side surfaces of the source-side holes 52a, 62a, and source-side columnar semiconductor layers 54a, 64a are formed on the side surfaces of the source-side gate insulation layers 53a, 63a. Furthermore, drain-side gate insulation layers 53b, 63b are formed on the side surfaces of the drain-side holes 52b, 62b, and drain-side columnar semiconductor layers 54b, 64b are formed on the side surfaces of the drain-side gate insulation layers 53b, 63b. Note that the memory semiconductor layer 44, the source-side columnar semiconductor layers 54a, 64a, and the drain-side columnar semiconductor layers 54b, 64b are formed so that a hollow Ag is left within themselves, and are subject to heat treatment (at 600 degrees C.) in an inert atmosphere (e.g., $N_2$) in order to improve their crystallinity.

Figure 15:
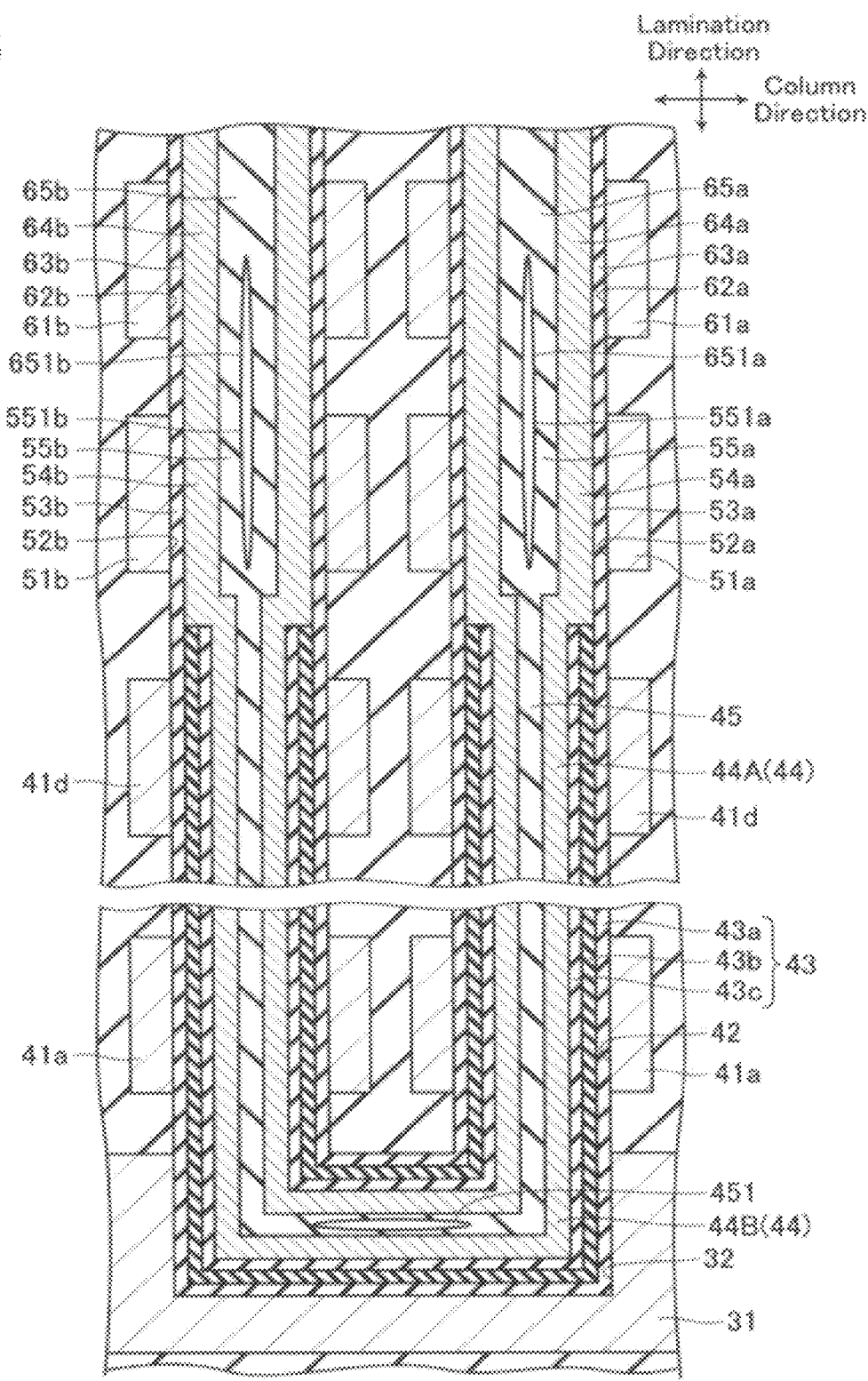
FIG. 15 is a cross-sectional view illustrating a manufacturing step of the memory cell array 11 according to the first embodiment.

Then, as illustrated in FIG. 15, inner insulation layers 45, 55a, 55b, 65a, and 65b are formed to fill up the hollow Ag. The inner insulation layers 45, 55a, 55b, 65a, and 65b are formed by oxidizing the respective side surfaces of the memory semiconductor layer 44, the source-side columnar semiconductor layers 54a, 64a, and the drain-side columnar semiconductor layers 54b, 64b, and then depositing silicon nitride on the resulting side surfaces.

Figure 16:
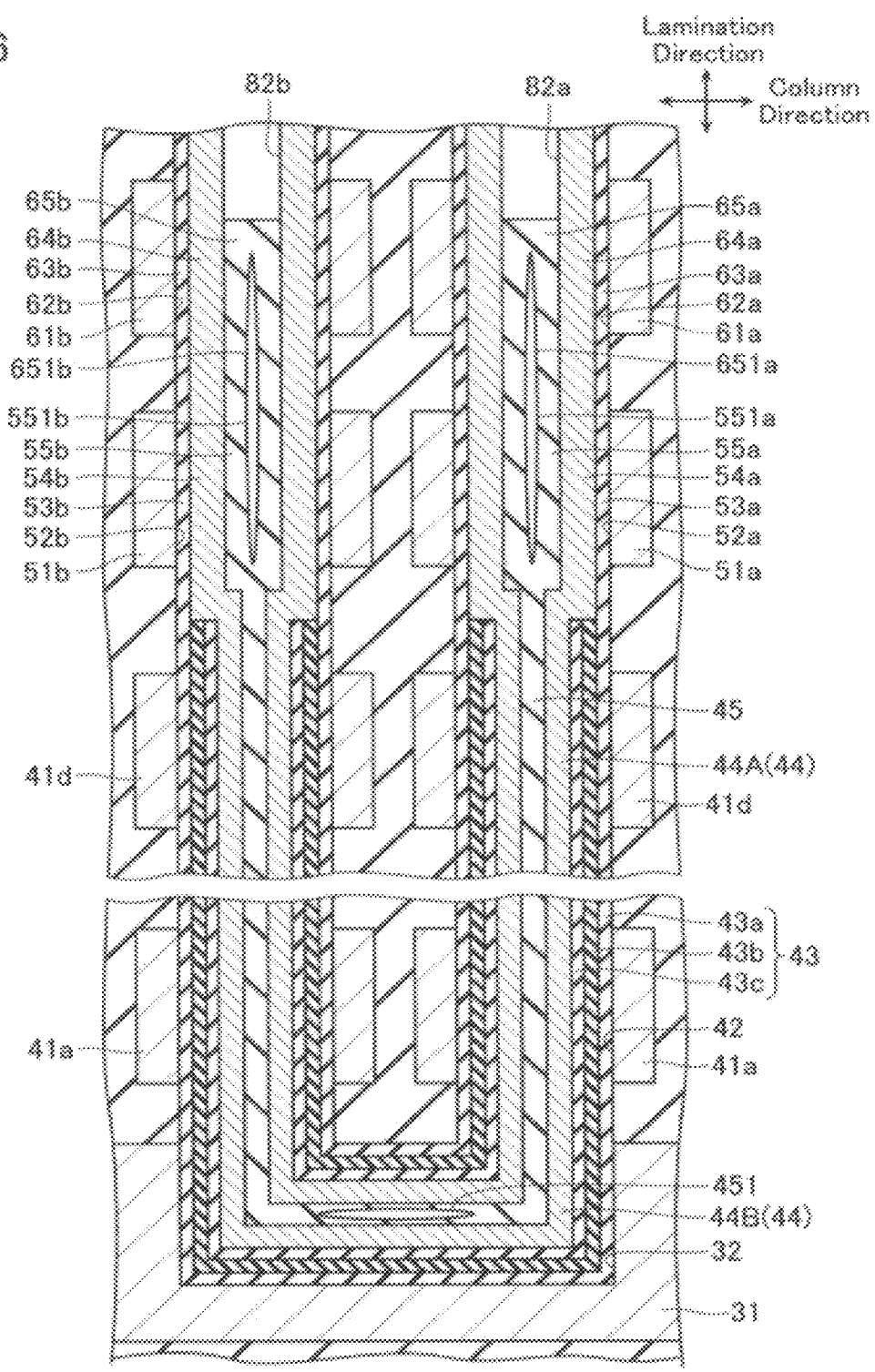
FIG. 16 is a cross-sectional view illustrating a manufacturing step of the memory cell array 11 according to the first embodiment.

Subsequently, as illustrated in FIG. 16, the internal insulation layers 65a and 65b are dug down until the top surfaces of internal insulation layers 65a and 65b are lowered to the height H2 from the bottom surfaces of the source-side conductive layers 61, thereby forming holes 82a and 82b. For example, the internal insulation layers 65a and 65b are dug down to a depth of on the order of 50 nm. Note that any oxide films formed on the surfaces of the holes 82a and 82b are removed with a diluted hydrofluoric acid solution.

Figure 17:
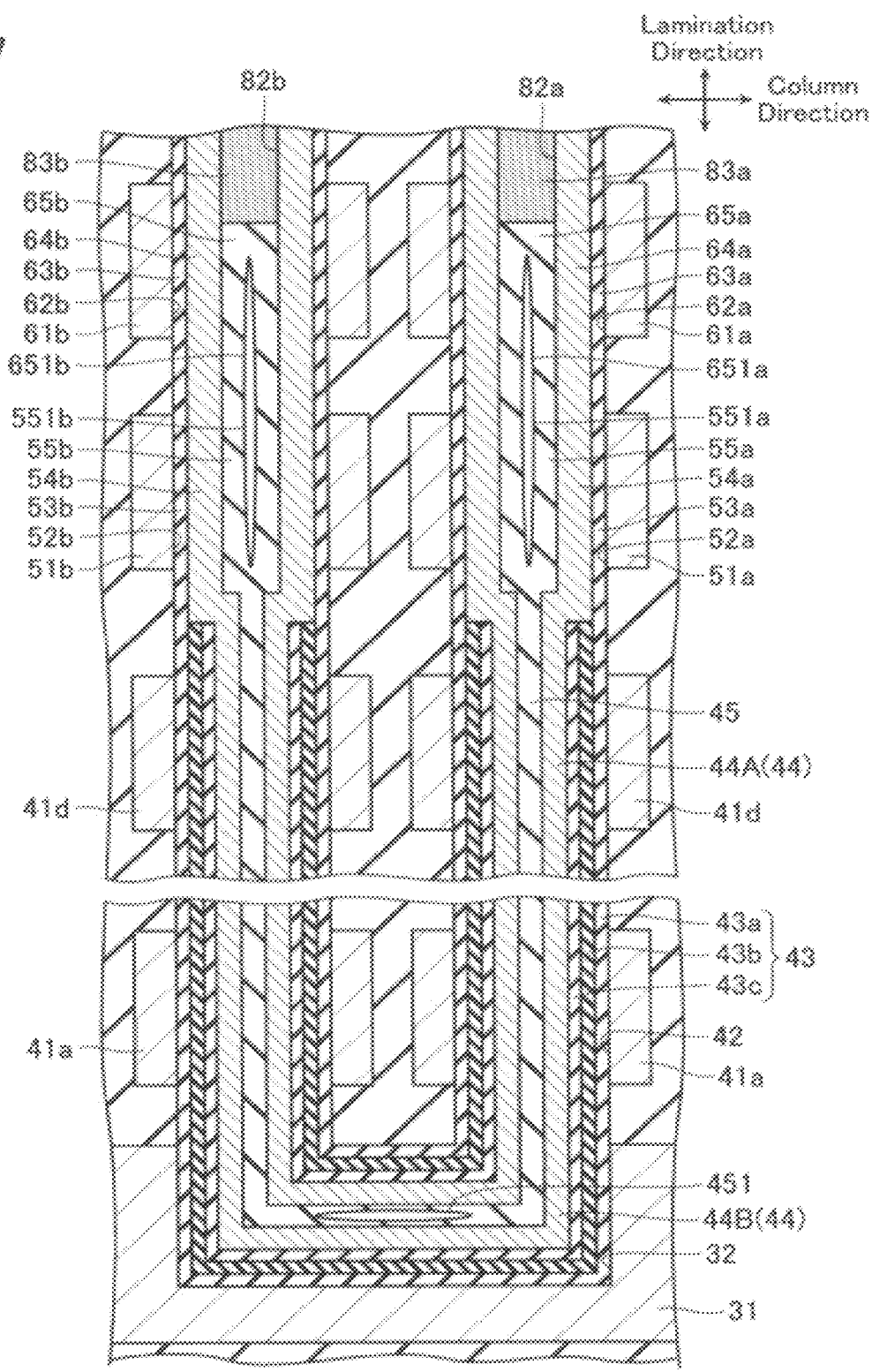
FIG. 17 is a cross-sectional view illustrating a manufacturing step of the memory cell array 11 according to the first embodiment.

Then, as illustrated in FIG. 17, nickel (Ni) is deposited to fill up the holes 82a and 82b, thereby forming metal layers (nickel) 83a and 83b. For example, nickel is deposited by CVD or sputtering.

Figure 18:
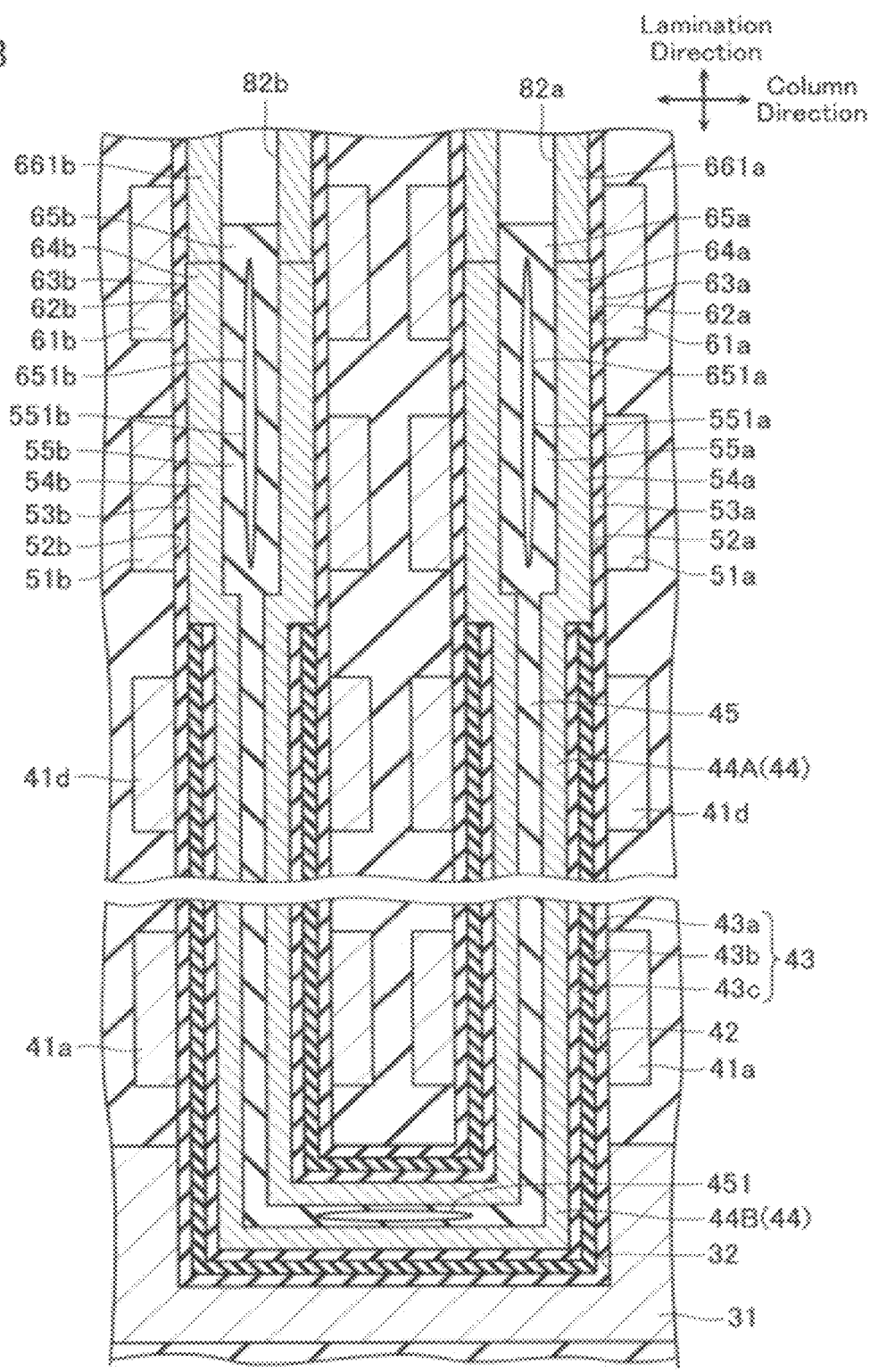
FIG. 18 is a cross-sectional view illustrating a manufacturing step of the memory cell array 11 according to the first embodiment.

Subsequently, heat treatment (at 400 degrees C.) is performed as illustrated in FIG. 18. Consequently, a part of the source-side columnar semiconductor layer 64a adjacent to the metal layer 83a is silicided to provide a first metal layer 661a (nickel silicide). In addition, a part of the drain-side columnar semiconductor layer 64b adjacent to the metal layer 83b is silicided to provide a first metal layer 661b (nickel silicide). After the silicidation, the metal layers 83a and 83b are removed with a sulfuric acid-hydrogen peroxide mixture, whereby the holes 82a and 82b are formed again.

Consider here that titanium (Ti), rather than nickel (Ni), is deposited as the metal layers 83a and 83b in the step of FIG. 17, and then silicidation is carried out in the step of FIG. 18. In this case, silicon atoms (Si) contained in the source-side columnar semiconductor layer 64a and the drain-side columnar semiconductor layer 64b are diffused into the metal layers 83a and 83b, in which case cavities may be produced in the source-side columnar semiconductor layer 64a and the drain-side columnar semiconductor layer 64b. In contrast, as in this embodiment, if nickel (Ni) is deposited as the metal layers 83a and 83b, then nickel atoms (Ni) are diffused into the source-side columnar semiconductor layer 64a and the drain-side columnar semiconductor layer 64b, in which case no cavities are produced in the source-side columnar semiconductor layer 64a and the drain-side columnar semiconductor layer 64b.

After the step of FIG. 18, tungsten (W) is deposited in the holes 82a and 82b to form second metal layers 662a and 662b. In addition, the top surfaces of the second metal layers 662a and 662b are planarized by CMP.

[Advantages]

Advantages of the first embodiment will now be described below. It should be noted that an erase operation was performed in the conventional art by generating a GIDL current due to generation of high electric fields at the gate ends of select transistors. In contrast, the first embodiment allows holes, rather than electrons, flowing from metal layers to be selected as the majority carrier by means of a source-side carrier selection element PSTr and a drain-side carrier selection element PDTr. As such, as compared with the conventional art, the first embodiment allows more holes to be provided at the time of erasing. Therefore, the first embodiment may perform erase operations more reliably than in the conventional art when the capacitance of the body of memory transistors increases as more layers are laminated. The first embodiment may also perform erase operations without having to generate high electric fields as would be needed in the conventional art.

Furthermore, unlike the conventional art, rather than generating a GIDL current by select transistor themselves, the first embodiment employs a method such that a majority carrier is determined by carrier selection elements, and the majority carrier is allowed to flow by means of on/off control of select transistors. Consequently, the first embodiment enables holes to be selectively injected into the electric charge accumulation layer of a particular cell by performing the erase operation as the reverse of the write operation with respect to the polarity of the applied voltage. That is, the first embodiment allows a selected cell to be erased, rather than erasing on a block-by-block base as is conventionally done. This may provide memory with reduced power consumption and higher reliability.

In addition, as described above, the gates of 2×n source-side carrier selection elements PSTr and drain-side carrier selection elements PDTr are each commonly connected to respective one carrier selection line PL. Therefore, the first embodiment may reduce the number of drivers for use in driving carrier selection lines PL, as well as the area occupied by the non-volatile semiconductor storage device.

[Second Embodiment]

[Configuration]

Figure 19:
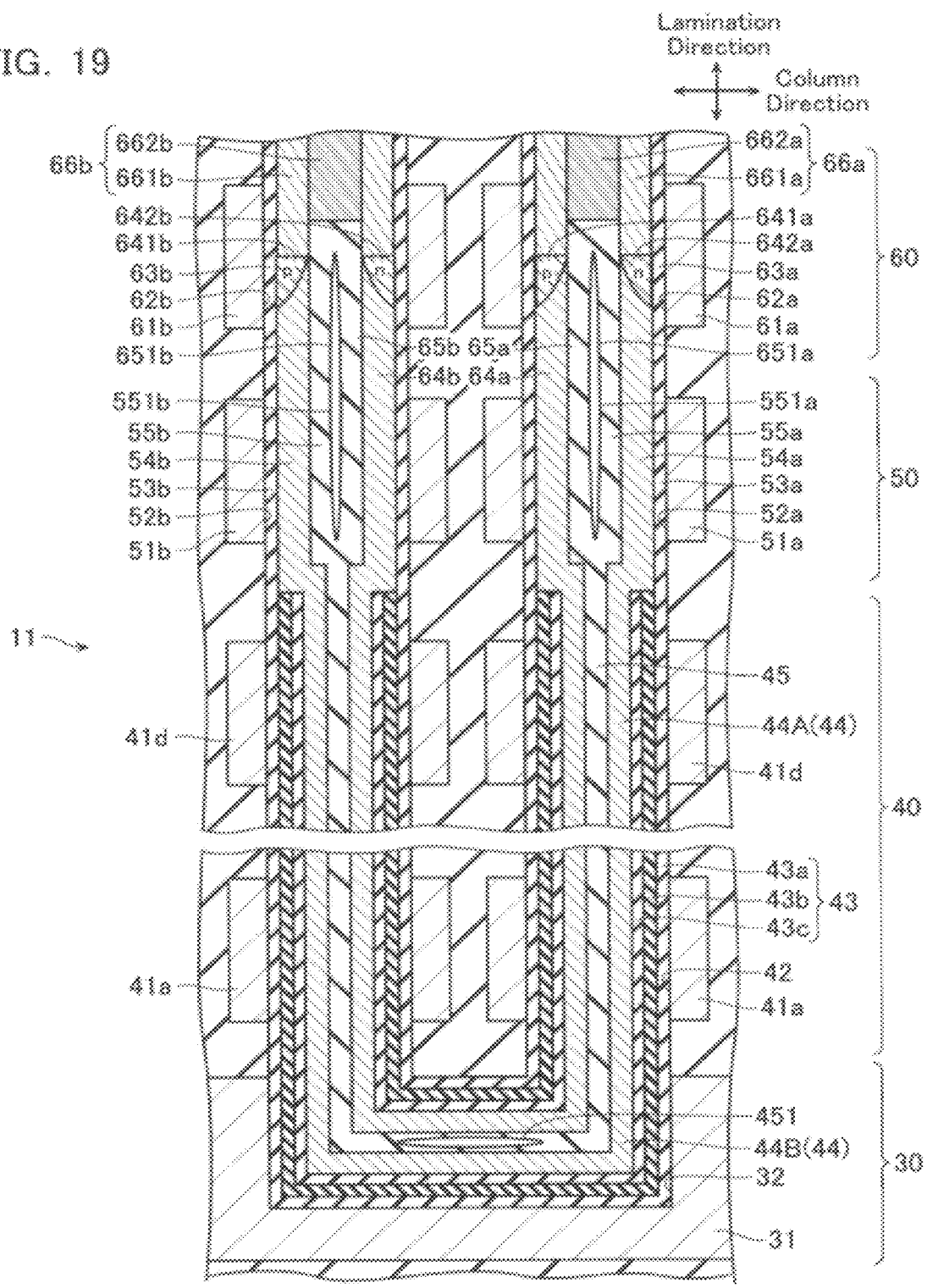
FIG. 19 is an enlarged cross-sectional view illustrating a memory cell array 11 according to a second embodiment.

Referring now to FIG. 19, the non-volatile semiconductor storage device according to a second embodiment will be described below. FIG. 19 is an enlarged cross-sectional view illustrating a memory cell array 11 according to the second embodiment. Note that the same reference numerals represent similar components to the first embodiment, and description thereof will be omitted in the second embodiment.

In addition to the configuration of the first embodiment (see FIG. 6), the non-volatile semiconductor storage device according to the second embodiment comprises p-type diffusion layers 641a and n-type diffusion layers 642a that are formed on the top surfaces of source-side columnar semiconductor layers 64a, as illustrated in FIG. 19. The non-volatile semiconductor storage device also comprises p-type diffusion layers 641b and n-type diffusion layers 642b that are formed on the top surfaces of drain-side columnar semiconductor layers 64b.

In addition, each first metal layer 661a has a Fermi level between those of each p-type diffusion layer 641a and each n-type diffusion layer 642a. Furthermore, each first metal layer 661b has a Fermi level between those of each p-type diffusion layer 641b and each n-type diffusion layer 642b.

[Manufacturing Method]

Now, a method of manufacturing the non-volatile semiconductor storage device according to the second embodiment will be described below. According to the second embodiment, after the step of FIG. 16 in the first embodiment, angled ion implantation is carried out on those parts of the source-side columnar semiconductor layer 64a and the drain-side columnar semiconductor layer 64b that are located close to the top surfaces of the internal insulation layers 65a and 65b. Through this step, p-type diffusion layers 641a, 641b and n-type diffusion layers 642a, 642b are formed. Subsequently, the p-type diffusion layers 641a, 641b and the n-type diffusion layers 642a, 642b are subject to heat treatment (at 1000 degrees C., for on the order of 1 sec), whereby the impurities contained therein are activated. Then, any oxide films formed on the surfaces of the source-side columnar semiconductor layer 64a and the drain-side columnar semiconductor layer 64b are removed with a diluted hydrofluoric acid solution.

[Advantages]

The second embodiment has a similar configuration and operates in a similar manner to the first embodiment. Therefore, the second embodiment has the same advantages as the first embodiment. Furthermore, as described above, the second embodiment comprises p-type diffusion layers 641a, 641b and n-type diffusion layers 642a, 642b. Then, each first metal layer 661a has a Fermi level between those of each p-type diffusion layer 641a and each n-type diffusion layer 642a, while each first metal layer 661b has a Fermi level between those of each p-type diffusion layer 641b and each n-type diffusion layer 642b. That is, the second embodiment may provide larger currents as compared with the first embodiment, allowing high-speed write/read/erase operations even if the material, concentration and the like that are involved in the first metal layers 661a and 661b are determined less precisely than the first embodiment.

[Third Embodiment]

[Configuration]

Figure 20:
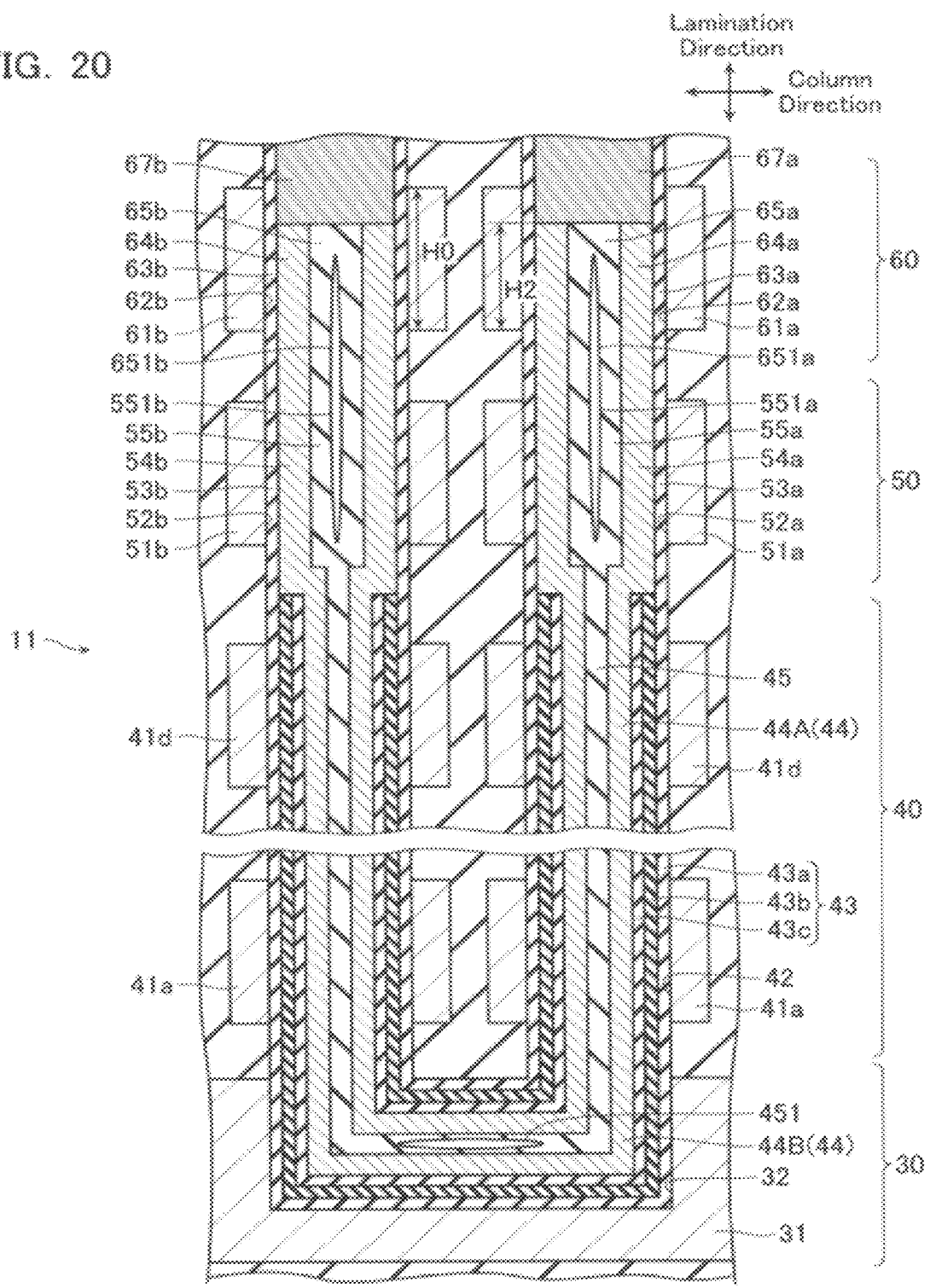
FIG. 20 is an enlarged cross-sectional view illustrating a memory cell array 11 according to a third embodiment.

Referring now to FIG. 20, the non-volatile semiconductor storage device according to a third embodiment will be described below. FIG. 20 is an enlarged cross-sectional view illustrating a memory cell array 11 according to the third embodiment. Note that the same reference numerals represent similar components to the first and second embodiments, and description thereof will be omitted in the third embodiment.

In the third embodiment, as illustrated in FIG. 20, the top surfaces of the source-side columnar semiconductor layer 64a and the internal insulation layer 65a are aligned at the height H2 from the bottom surface of the source-side conductive layer 61a. The top surfaces of the drain-side columnar semiconductor layer 64b and the internal insulation layer 65b are also aligned at the height H2 from the bottom surface of the drain-side conductive layer 61b. Furthermore, the non-volatile semiconductor storage device according to the second embodiment comprises metal layers 67a and 67b, instead of the metal layers 66a and 66b of the first embodiment. In this respect, the third embodiment is different from the second embodiment.

Each metal layer 67a is formed in a columnar shape extending in the lamination direction so that it comes in contact with the top surface of the source-side columnar semiconductor layer 64a, the top surface of the internal insulation layer 65a, and the side surface of the source-side gate insulation layer 63a. Each metal layer 67a is formed to fill up the source-side hole 62a. Each metal layer 67a is electrically connected to the source-side columnar semiconductor layer 64a. Each metal layer 67a comprises, e.g., nickel silicide (NiSi).

Each metal layer 67b is formed in a columnar shape extending in the lamination direction so that it comes in contact with the top surface of the drain-side columnar semiconductor layer 64b, the top surface of the internal insulation layer 65b, and the side surface of a drain-side gate insulation layer 63b. Each metal layer 67b is formed to fill up the drain-side hole 62b. Each metal layer 67b is in ohmic contact with a drain-side columnar semiconductor layer 64b. Each metal layer 67b comprises, e.g., nickel silicide (NiSi).

[Manufacturing Method]

Figure 21:
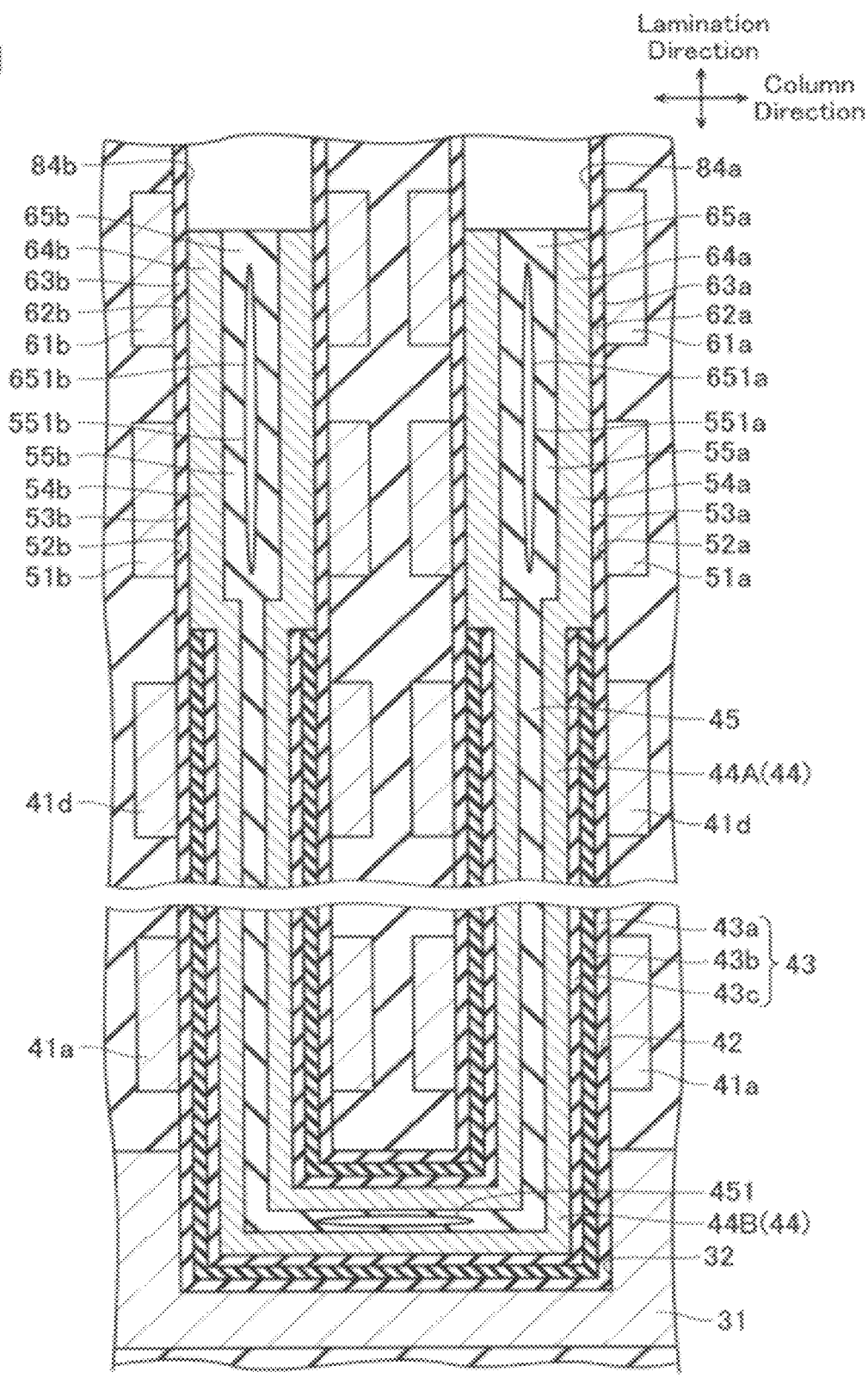
FIG. 21 is a cross-sectional view illustrating a manufacturing step of the memory cell array 11 according to the third embodiment.

Referring now to FIG. 21, a method of manufacturing the non-volatile semiconductor storage device according to the third embodiment will be described below. In the third embodiment, the method performs a step as illustrated in FIG. 21, instead of the step of FIG. 16 in the first embodiment. That is, as illustrated in FIG. 21, the internal insulation layers 65a, 65b, the source-side columnar semiconductor layer 64a, and the drain-side columnar semiconductor layer 64b are dug down until the top surfaces of the internal insulation layers 65a, 65b, the source-side columnar semiconductor layer 64a, and the drain-side columnar semiconductor layer 64b are lowered to the height H2 from the bottom surfaces of the source-side conductive layers 61. As a result, holes 84a and 84b are formed.

After the step of FIG. 21, metal layers 67a and 67b are formed to fill up the holes 84a and 84b.

[Advantages]

The third embodiment has a similar configuration and operates in a similar manner to the first embodiment. Therefore, the third embodiment has the same advantages as the first embodiment. Furthermore, the third embodiment may offer more simple manufacturing steps and less manufacturing costs than the first embodiment.

[Fourth Embodiment]

[Configuration]

Figure 22:
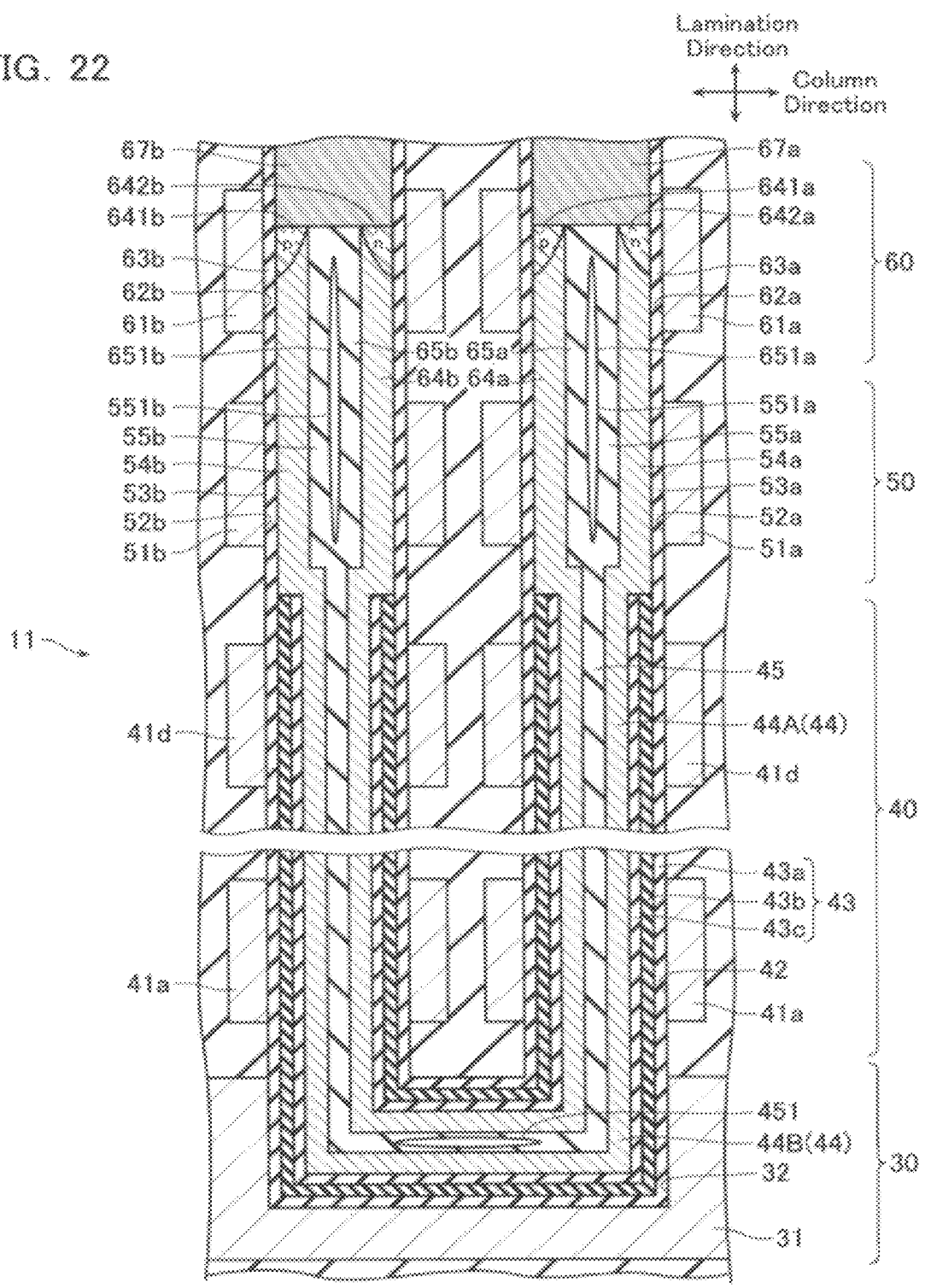
FIG. 22 is an enlarged cross-sectional view illustrating a memory cell array 11 according to a fourth embodiment.

Referring now to FIG. 22, the non-volatile semiconductor storage device according to a fourth embodiment will be described below. FIG. 22 is an enlarged cross-sectional view illustrating a memory cell array 11 according to the fourth embodiment. Note that the same reference numerals represent similar components to the first to third embodiments, and description thereof will be omitted in the fourth embodiment.

In addition to the configuration of the third embodiment (see FIG. 20), the non-volatile semiconductor storage device according to the fourth embodiment comprises p-type diffusion layers 641a and n-type diffusion layers 642a that are formed on the top surfaces of source-side columnar semiconductor layers 64a, as illustrated in FIG. 22. The non-volatile semiconductor storage device also comprises p-type diffusion layers 641b and n-type diffusion layers 642b that are formed on the top surfaces of drain-side columnar semiconductor layers 64b.

In addition, each metal layer 67a has a Fermi level between those of each p-type diffusion layer 641a and each n-type diffusion layer 642a. Furthermore, each metal layer 67b has a Fermi level between those of each p-type diffusion layer 641b and each n-type diffusion layer 642b.

[Manufacturing Method]

A method of manufacturing the non-volatile semiconductor storage device according to the fourth embodiment will now be described below. In the fourth embodiment, after the step of FIG. 21 in the third embodiment, angled ion implantation is carried out on those parts of the source-side columnar semiconductor layer 64a and the drain-side columnar semiconductor layer 64b that are located close to the top surfaces of the internal insulation layers 65a and 65b. Through this step, p-type diffusion layers 641a, 641b and n-type diffusion layers 642a, 642b are formed.

[Advantages]

The fourth embodiment has a similar configuration and operates in a similar manner to the first through third embodiments. Therefore, the fourth embodiment has the same advantages as the first through third embodiments.

[Fifth Embodiment]

[Configuration]

The following description will be made on the non-volatile semiconductor storage device according to a fifth embodiment. Note that the same reference numerals represent similar components to the first through fourth embodiments, and description thereof will be omitted in the fifth embodiment.

In the fifth embodiment, the memory semiconductor layer 44, the source-side columnar semiconductor layers 54a, 64a, and the drain-side columnar semiconductor layers 54b, 64b comprise germanium (Ge) or silicon germanium (SiGe). This is the difference from the first to fourth embodiments.

[Operation]

Figure 23:
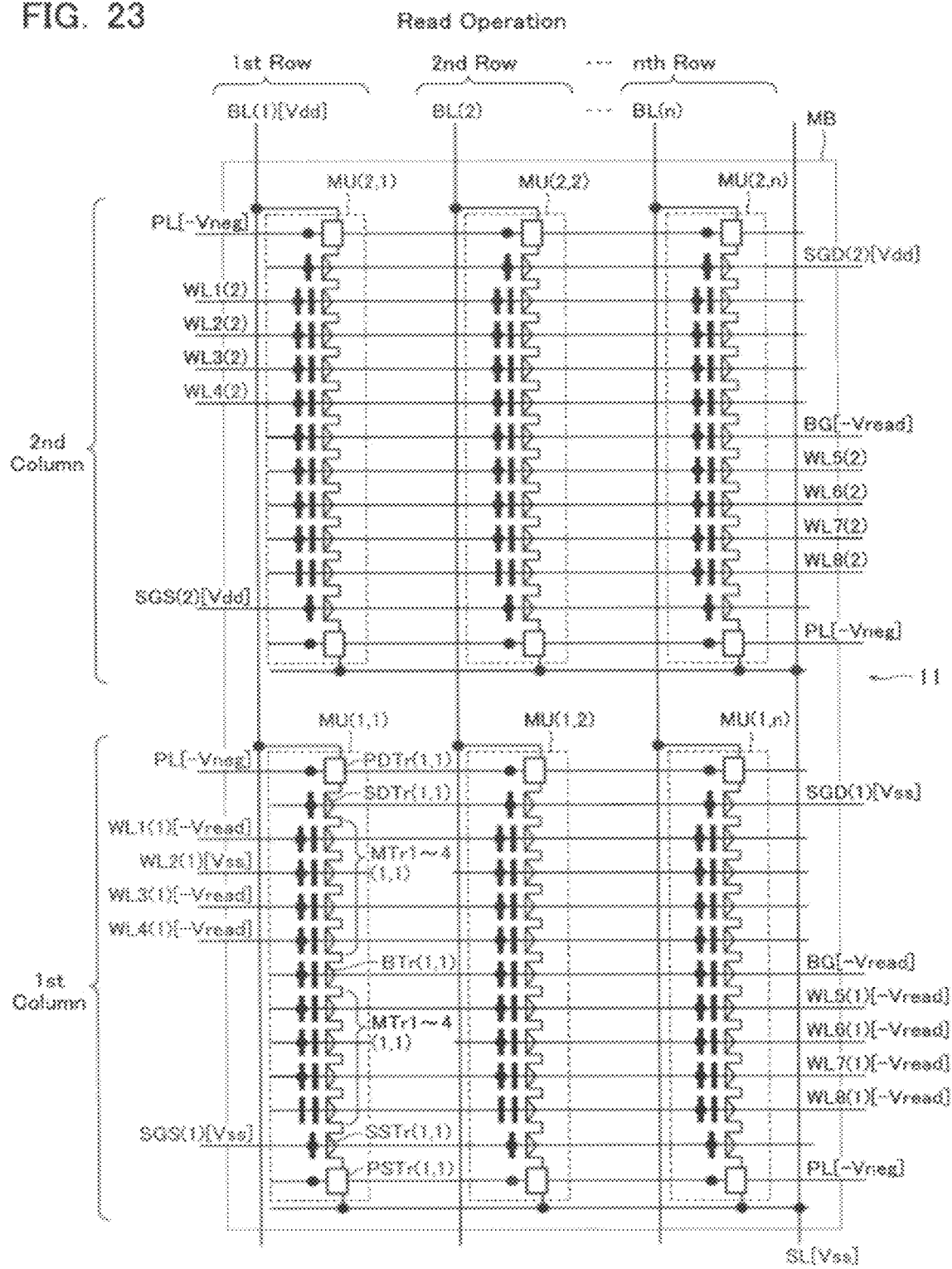
FIG. 23 is a circuit diagram illustrating a read operation in a fifth embodiment.

Referring now to FIG. 23, a read operation of the non-volatile semiconductor storage device according to the fifth embodiment will be described below. As illustrated in FIG. 23, the control circuit 12 applies a negative voltage −Vneg to the carrier selection lines PL. Consequently, the memory transistors MTr1 to 8, the back-gate transistors BTr, the drain-side select transistor SDTr, and the source-side select transistor SSTr serve as PMOS transistors.

Then, as illustrated in FIG. 23, the control circuit 12 applies the power supply voltage Vdd to the bit line BL(1) in the first row. In addition, the control circuit 12 applies the ground voltage Vss to the source line SL. Furthermore, the control circuit 12 applies the ground voltage Vss to the source-side select gate line SGS(1) and the drain-side select gate line SGD(1) in the first column, while applying the power supply voltage Vdd to the source-side select gate line SGS(2) and the drain-side select gate line SGD(2) in the second column. The control circuit 12 applies a negative read voltage −Vread (e.g., −5V) to the word lines WL1(1) and 3(1) to 8(1) in the first column, while applying the ground voltage Vss to the word line WL2(1) in the first column. The control circuit 12 applies the negative read voltage −Vread to the back-gate line BG.

Through this voltage control, the control circuit 12 detects whether or not a current flows from the bit line BL(1) into the source line SL via the memory transistor MTr2(1,1) to read data from the memory transistor MTr2(1,1). Note that the control circuit 12 of the fifth embodiment provides the same control as the first embodiment in write and erase operations.

[Advantages]

The fifth embodiment has a similar configuration and operates in a similar manner to the first embodiment. Therefore, the fifth embodiment has the same advantages as the first embodiment.

[Sixth Embodiment]

[Configuration]

Figure 24:
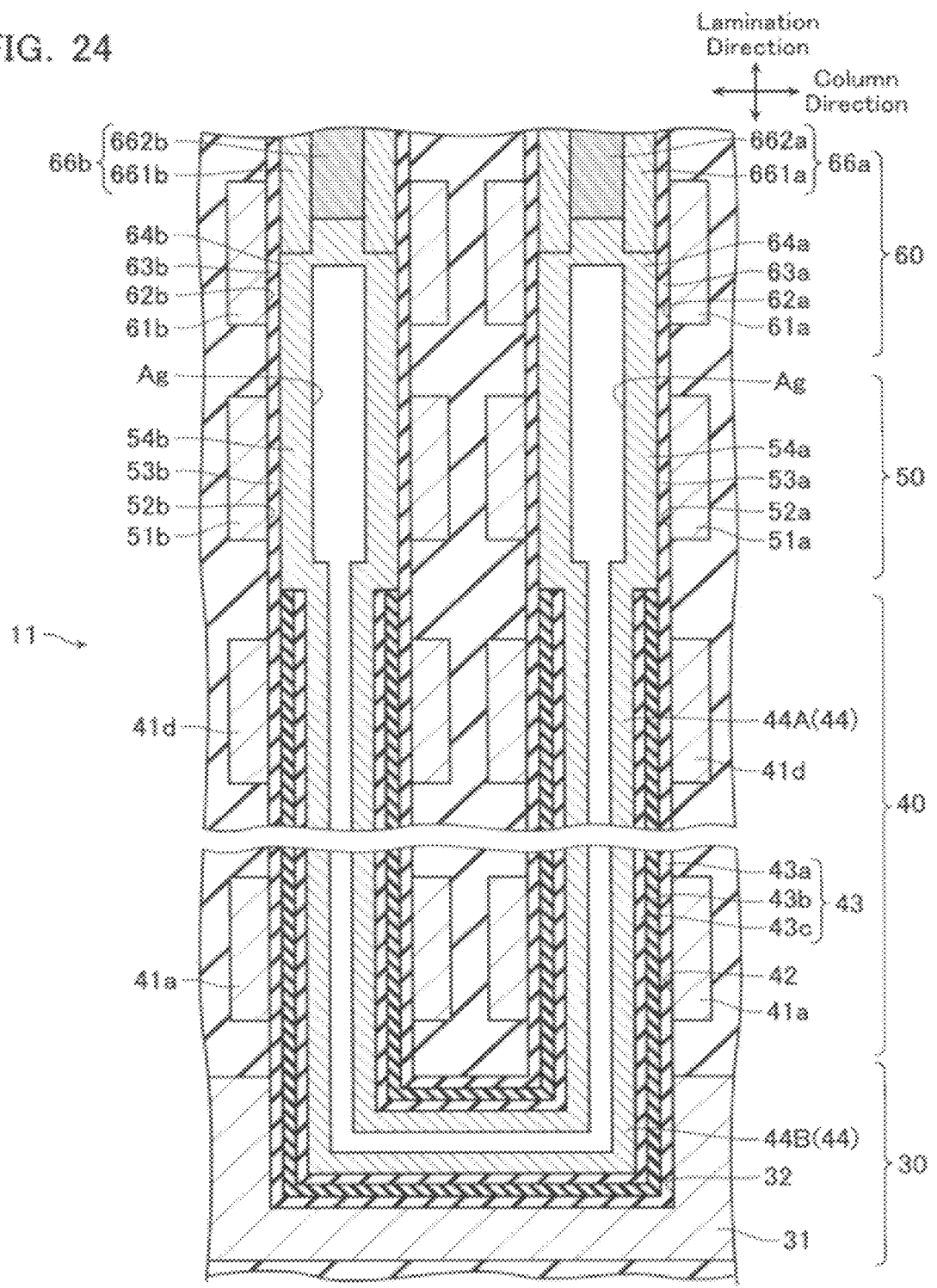
FIG. 24 is an enlarged cross-sectional view of a memory cell array 11 according to a sixth embodiment.

Referring now to FIG. 24, the non-volatile semiconductor storage device according to a sixth embodiment will be described below. FIG. 24 is an enlarged cross-sectional view illustrating a lamination structure of the non-volatile semiconductor storage device according to the sixth embodiment. Note that the same reference numerals represent similar components to the first through fifth embodiments, and description thereof will be omitted in the sixth embodiment.

As illustrated in FIG. 24, the non-volatile semiconductor storage device according to the sixth embodiment does not have inner insulation layers 45, 55a, 55b, 65a, and 65b. Alternatively, the memory semiconductor layer 44, the source-side columnar semiconductor layers 54a, 64a, and the drain-side columnar semiconductor layers 54b, 64b have a hollow Ag. In this respect, the sixth embodiment is different from the first through fifth embodiments.

[Advantages]

The sixth embodiment has a similar configuration and operates in a similar manner to the first embodiment. Therefore, the sixth embodiment has the same advantages as the first embodiment.

[Seventh Embodiment]

[Configuration]

Figure 25:
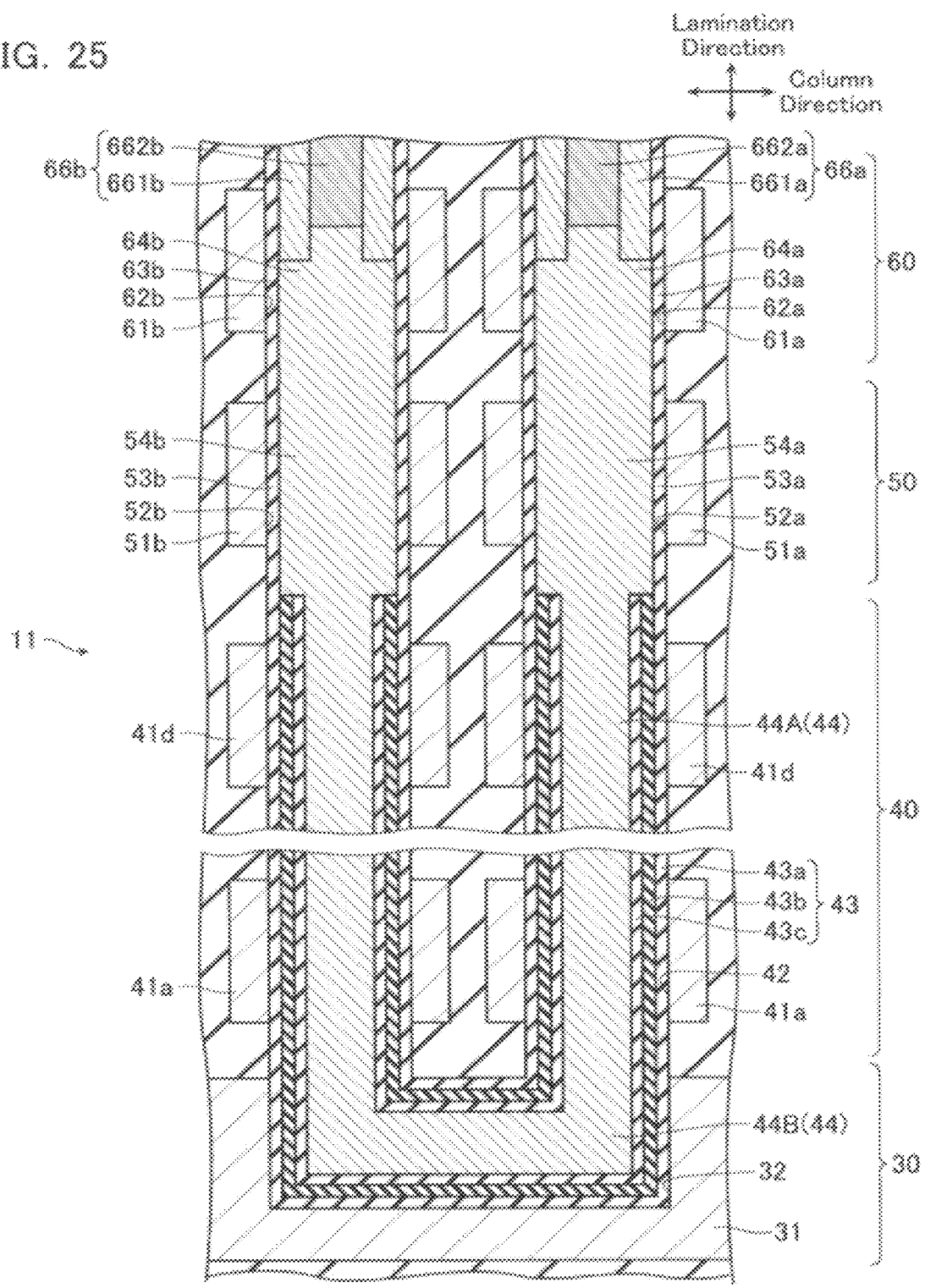
FIG. 25 is an enlarged cross-sectional view of a memory cell array 11 according to a seventh embodiment.

Referring now to FIG. 25, the non-volatile semiconductor storage device according to a seventh embodiment will be described below. FIG. 25 is an enlarged cross-sectional view illustrating a lamination structure of the non-volatile semiconductor storage device according to the seventh embodiment. Note that the same reference numerals represent similar components to the first through sixth embodiments, and description thereof will be omitted in the seventh embodiment.

As illustrated in FIG. 25, the non-volatile semiconductor storage device according to the seventh embodiment does not have inner insulation layers 45, 55a, 55b, 65a, and 65b. Furthermore, the memory semiconductor layer 44, the source-side columnar semiconductor layers 54a, 64a, and the drain-side columnar semiconductor layers 54b, 64b are formed, without a hollow Ag, to fill up the back-gate hole 32, the memory hole 42, the source-side holes 52a, 62a, and the drain-side holes 52b, 62b.

[Advantages]

The seventh embodiment has a similar configuration and operates in a similar manner to the first embodiment. Therefore, the seventh embodiment has the same advantages as the first embodiment.

[Eighth Embodiment]

[Configuration]

Figure 26:
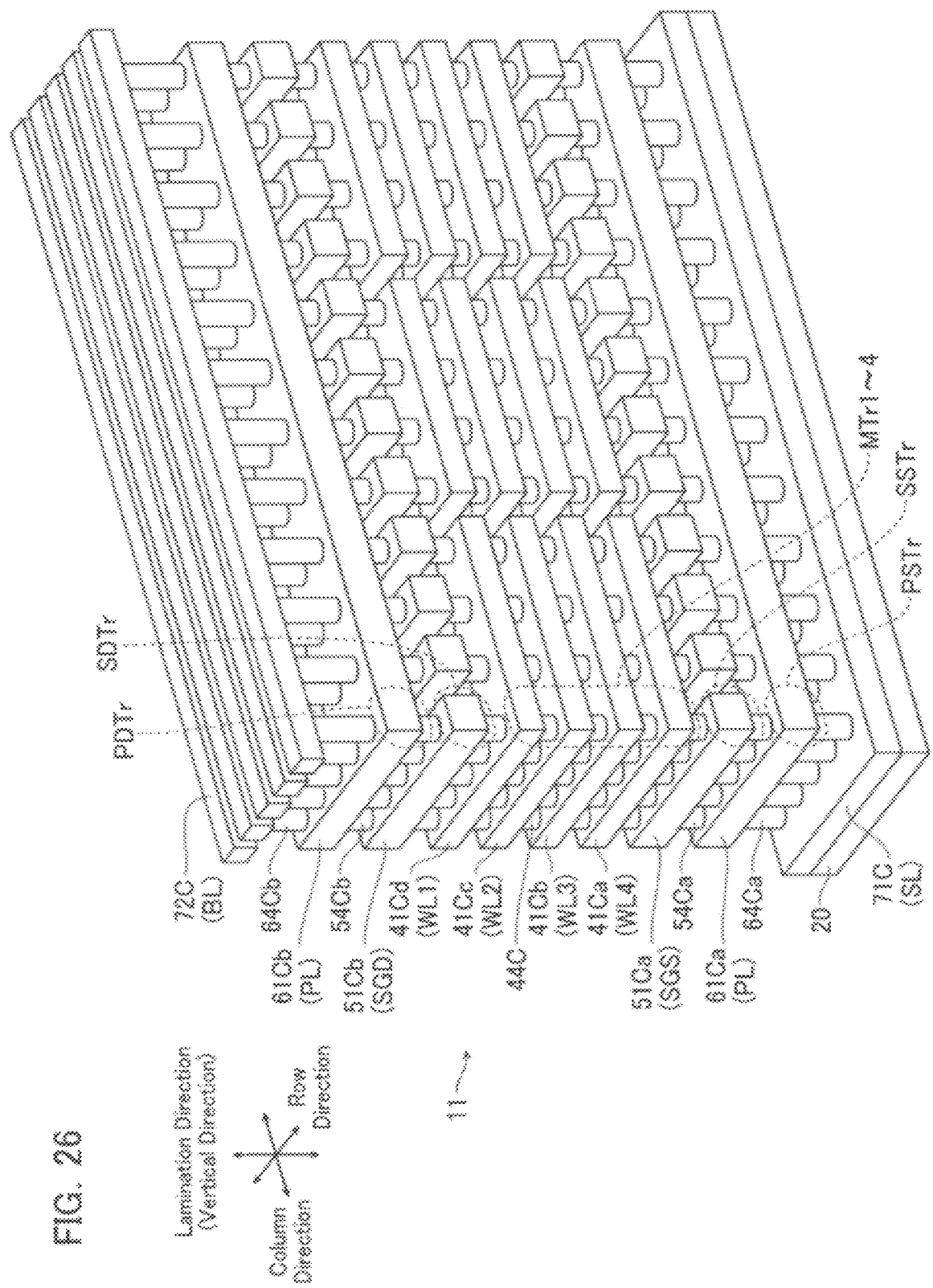
FIG. 26 is a perspective view illustrating a lamination structure of a memory cell array 11 according to an eighth embodiment.

Referring now to FIG. 26, the non-volatile semiconductor storage device according to an eighth embodiment will be described below. FIG. 26 is a perspective view illustrating a lamination structure of the non-volatile semiconductor storage device according to the eighth embodiment. Note that the same reference numerals represent similar components to the first through seventh embodiments, and description thereof will be omitted in the eighth embodiment.

Recall that in the first through seventh embodiments, each memory semiconductor layer 44 is formed in a U-shape extending in the lamination direction, as viewed from the row direction. In contrast, as illustrated in FIG. 26, each memory semiconductor layer 44C according to the eighth embodiment is formed in an I-shape (columnar shape), as viewed from the row and column directions. Word-line conductive layers 41Ca to 41Cd are separated in memory blocks MB and formed in a plate-like shape so as to surround those memory columnar semiconductor layers 44C aligned in the row and column directions via memory gate insulation layers 43, respectively.

In addition, each source-side columnar semiconductor layer 54Ca is formed to extend in the lamination direction downward from the bottom surface of a memory columnar semiconductor layer 44C. Each drain-side columnar semiconductor layer 54Cb is formed to extend in the lamination direction from the top surface of a memory columnar semiconductor layer 44C. Source-side conductive layers 51Ca are formed in a stripe pattern so as to surround those source-side columnar semiconductor layers 54Ca that are arranged in line in the row direction via source-side gate insulation layers 53a, respectively. Drain-side conductive layers 51Cb are formed in a stripe pattern so as to surround those drain-side columnar semiconductor layers 54Cb that are arranged in line in the row direction via drain-side gate insulation layers 53b, respectively.

Each source-side columnar semiconductor layer 64Ca is formed to extend in the lamination direction downward from the bottom surface of a source-side columnar semiconductor layer 54Ca. Each drain-side columnar semiconductor layer 64Cb is formed to extend in the lamination direction from the top surface of a drain-side columnar semiconductor layer 54Cb. A source-side conductive layer 61Ca is formed to surround those source-side columnar semiconductor layers 64Ca that are aligned in the row and column directions via source-side gate insulation layers 63a. The source-side conductive layer 61Ca is formed in a rectangular plate shape, as viewed from the lamination direction. A drain-side conductive layer 61Cb is formed to surround those drain-side columnar semiconductor layers 64Cb that are aligned in the row and column directions via drain-side gate insulation layers 63b. The drain-side conductive layer 61Cb is formed in a rectangular plate shape, as viewed from the lamination direction.

In addition, a diffusion layer 71C is formed on the top surface of the substrate 20 at positions matching the source-side columnar semiconductor layers 64Ca. The diffusion layer 71C functions as the source line SL. Bit-line layers 72C are formed in contact with the top surfaces of the drain-side columnar semiconductor layers 64Cb.

[Advantages]

The eighth embodiment has a similar configuration and operates in a similar manner to the first embodiment. Therefore, the eighth embodiment has the same advantages as the first embodiment.

[Other Embodiments]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, in the first and third embodiments, it is contemplated that the first metal layers 661a, 661b and the metal layers 67a, 67b may comprise any material, not limited to nickel silicide (NiSi), that would be in ohmic contact with the source-side columnar semiconductor layers 64a and the drain-side columnar semiconductor layers 64b.

In the first through eighth embodiments, the first metal layers 661a, 661b and the metal layers 67a, 67b may comprise metal-silicide (e.g. $NiSi_2$), or metal-germanide (e.g. $NiGe$, $NiGe_2$).

What is claimed is:

1. A non-volatile semiconductor storage device comprising:
   a memory string including a plurality of memory transistors connected in series;
   a select transistor having one end connected to one end of the memory string;
   a carrier selection element having one end connected to the other end of the select transistor, the carrier selection element operative to select a majority carrier flowing through respective bodies of the memory transistors and the select transistor; and
   a control circuit configured to control respective states of the memory string, the select transistor, and the carrier selection element,
   the select transistor comprising:
      a second semiconductor layer extending in a vertical direction to a substrate and functioning as a body of the select transistor;
      a first gate insulation layer formed to surround the second semiconductor layer; and
      a second conductive layer formed to surround the second semiconductor layer via the first gate insulation layer and to extend in a parallel direction to the substrate, the second conductive layer functioning as a gate of the select transistor,
   the carrier selection element comprising:
      a third semiconductor layer extending in the vertical direction to the substrate and functioning as a body of the carrier selection element;
      a metal layer extending in the vertical direction to the substrate from a top surface of the third semiconductor layer;
      a second gate insulation layer formed to surround the third semiconductor layer and the metal layer; and
      a third conductive layer formed to surround the third semiconductor layer and the metal layer via the second gate insulation layer and to extend in a parallel direction to the substrate, the third conductive layer functioning as a gate of the carrier selection element.

2. The non-volatile semiconductor storage device according to claim 1, wherein
   the memory string comprises:
      a first semiconductor layer having a columnar portion extending in the vertical direction to the substrate and functioning as a body of the memory transistors;
      an electric charge accumulation layer formed to surround the columnar portion and changing a threshold voltage of the memory transistors by accumulating electric charges; and
      first conductive layers formed to surround the columnar portion via the electric charge accumulation layer and to extend in a parallel direction to the substrate, the first conductive layers functioning as gates of the memory transistors.

3. The non-volatile semiconductor storage device according to claim 1, wherein
   the control circuit is configured to cause electrons to be the majority carrier by applying a positive voltage to the gate of the carrier selection element when performing a write operation on the memory transistors, and cause holes to the majority carrier by applying a negative voltage to the gate of the carrier selection element when performing an erase operation on the memory transistors.

4. The non-volatile semiconductor storage device according to claim 1, wherein
   the carrier selection element further comprises a p-type diffusion layer and an n-type diffusion layer each formed on the top surface of the third semiconductor layer.

5. The non-volatile semiconductor storage device according to claim 1, further comprising:
   a wiring commonly connected to gates of a plurality of the carrier selection elements arranged in a matrix form within a plane parallel to the substrate,
   wherein the third conductive layer is formed to surround a plurality of the third semiconductor layers and the metal layers that are arranged in a matrix form within the plane parallel to the substrate, and functions as the wiring.

6. The non-volatile semiconductor storage device according to claim 1, wherein
   the metal layer comprises silicide or germanide.

7. The non-volatile semiconductor storage device according to claim 6, wherein
   the metal layer comprises nickel silicide.

8. The non-volatile semiconductor storage device according to claim 1, wherein
   the third semiconductor layer comprises germanium or silicon germanium.

9. The non-volatile semiconductor storage device according to claim 8, wherein
   the control circuit is configured to cause holes to the majority carrier by applying a negative voltage to the gate of the carrier selection element when performing a read operation on the memory transistors.

10. The non-volatile semiconductor storage device according to claim 1, wherein
the third semiconductor layer comprises polysilicon.

11. The non-volatile semiconductor storage device according to claim 10, wherein
the control circuit is configured to cause electrons to the majority carrier by applying a positive voltage to the gate of the carrier selection element when performing a read operation on the memory transistors.

12. The non-volatile semiconductor storage device according to claim 5, wherein
the third conductive layer is formed in a comb-like shape or rectangular plate shape as viewed from the vertical direction to the substrate.

13. The non-volatile semiconductor storage device according to claim 2, wherein
the first semiconductor layer further comprises a joining portion joining lower ends of a pair of the columnar portions.

14. The non-volatile semiconductor storage device according to claim 2, wherein
the first semiconductor layer, the second semiconductor layer, and the third semiconductor layer have a hollow.

15. The non-volatile semiconductor storage device according to claim 1, wherein
the control circuit is configured to, at the time of the erase operation, selectively erase data stored in a selected one of the memory transistors included in a selected one of the memory strings.

16. A method of manufacturing a non-volatile semiconductor storage device, the method comprising:
laminating a plurality of first conductive layers, a second conductive layer, and a third conductive layer;
forming a hole to penetrate the plurality of first conductive layers, the second conductive layer, and the third conductive layer;
forming a first gate insulation layer, a second gate insulation layer, and a third gate insulation layer on respective side surfaces of the plurality of first conductive layers, the second conductive layer, and the third conductive layer, the side surfaces facing the hole;
forming a first semiconductor layer and a second semiconductor layer on respective side surfaces of the first gate insulation layer, and the second gate insulation layer, the side surfaces facing the hole, and forming a third semiconductor layer on a side surface of the third gate insulation layer to a certain position between bottom and top surfaces of the third conductive layer, the side surface facing the hole; and
forming a metal layer upward from the certain position on a side surface of the third gate insulation layer, the side surface facing the hole.

17. The method of manufacturing the non-volatile semiconductor storage device according to claim 16, the method further comprising:
prior to forming the metal layer, additionally forming the third semiconductor layer upward from the certain position; and
siliciding a part of the third semiconductor layer located at or above the certain position to form the metal layer.

18. The method of manufacturing the non-volatile semiconductor storage device according to claim 17, wherein
the metal layer comprises nickel silicide.

19. The method of manufacturing the non-volatile semiconductor storage device according to claim 16, the method further comprising:
performing ion implantation on the top surface of the third semiconductor layer to form an n-type diffusion layer and a p-type diffusion layer.

20. The method of manufacturing the non-volatile semiconductor storage device according to claim 16, wherein
the first semiconductor layer, the second semiconductor layer, and the third semiconductor layer comprise any of polysilicon, germanium, and silicon germanium.

* * * * *